(12) United States Patent
Fujii

(10) Patent No.: US 12,501,540 B2
(45) Date of Patent: Dec. 16, 2025

(54) ELECTRONIC DEVICE AND MANUFACTURING METHOD THEREOF

(71) Applicant: FUJIFILM Corporation, Tokyo (JP)

(72) Inventor: Yusuke Fujii, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 173 days.

(21) Appl. No.: 18/587,832

(22) Filed: Feb. 26, 2024

(65) Prior Publication Data

US 2024/0196519 A1 Jun. 13, 2024

Related U.S. Application Data

(63) Continuation of application No. PCT/JP2022/032678, filed on Aug. 30, 2022.

(30) Foreign Application Priority Data

Sep. 2, 2021 (JP) ................................. 2021-143242

(51) Int. Cl.
*H05K 1/02* (2006.01)
*H05K 1/18* (2006.01)
*H05K 9/00* (2006.01)

(52) U.S. Cl.
CPC ........... *H05K 1/023* (2013.01); *H05K 1/0215* (2013.01); *H05K 1/181* (2013.01); *H05K 9/0022* (2013.01);
(Continued)

(58) Field of Classification Search
CPC ............ H05K 1/02; H05K 1/023; H05K 1/18; H05K 1/181–187; H01L 23/498; H01L 23/49838; H01L 23/552; H01L 23/576
(Continued)

(56) References Cited

U.S. PATENT DOCUMENTS 5,639,989 A * 6/1997 Higgins, III .......... H01L 23/552
174/394
6,082,443 A * 7/2000 Yamamoto ............ F28D 15/046
174/15.2
(Continued)

FOREIGN PATENT DOCUMENTS

| JP | 2018060990 | 4/2018 |
| JP | 2019091866 | 6/2019 |
| WO | 2016052225 | 4/2016 |

OTHER PUBLICATIONS

"International Search Report (Form PCT/ISA/210) of PCT/JP2022/032678," mailed on Nov. 15, 2022, with English translation thereof, pp. 1-5.

(Continued)

*Primary Examiner* — Tuan T Dinh
(74) *Attorney, Agent, or Firm* — JCIPRNET

(57) ABSTRACT

Provided are: an electronic device including a wiring board having a mounting surface, a ground electrode that defines a ground region on the mounting surface, an electronic component that is located on the mounting surface and is disposed in the ground region, an insulating protective layer that is disposed in the ground region and covers the electronic component, and an electromagnetic wave shielding layer that is provided to extend over the insulating protective layer and the ground electrode and that covers the insulating protective layer and is electrically connected to the ground electrode, the electromagnetic wave shielding layer being a solidified product of an ink for forming an electromagnetic wave shielding layer, in which a void ratio S1, which is a void ratio of a portion of the electromagnetic wave shielding layer located on the ground electrode, is lower than a void ratio S2, which is a void ratio of a portion of the electromagnetic wave shielding layer located on the insulating protective layer; and a manufacturing method thereof.

8 Claims, 4 Drawing Sheets

(52) U.S. Cl.
CPC ... *H05K 9/0081* (2013.01); *H05K 2201/0715* (2013.01)

(58) Field of Classification Search
USPC .................. 361/792–795, 800, 816, 818; 257/659–690, 728–730
See application file for complete search history.

(56) References Cited

U.S. PATENT DOCUMENTS

| | | | |
|---|---|---|---|
| 7,752,751 B2* | 7/2010 | Kapusta | C23C 14/046 427/96.4 |
| 8,008,753 B1* | 8/2011 | Bolognia | H01L 25/0655 257/659 |
| 8,716,606 B2* | 5/2014 | Kelley | H01L 23/576 174/382 |
| 10,080,317 B2* | 9/2018 | Toleno | H05K 3/284 |
| 11,178,778 B2* | 11/2021 | Nomura | H01L 23/28 |
| 2020/0367393 A1* | 11/2020 | Mun | H01L 23/49838 |

OTHER PUBLICATIONS

"Written Opinion of the International Searching Authority (Form PCT/ISA/237) of PCT/JP2022/032678," mailed on Nov. 15, 2022, with English translation thereof, pp. 1-6.

* cited by examiner

ELECTRONIC DEVICE AND MANUFACTURING METHOD THEREOF

CROSS-REFERENCE TO RELATED APPLICATIONS

This application is a continuation application of International Application No. PCT/JP2022/032678, filed Aug. 30, 2022, the disclosure of which is incorporated herein by reference in its entirety. Further, this application claims priority from Japanese Patent Application No. 2021-143242, filed Sep. 2, 2021, the disclosure of which is incorporated herein by reference in its entirety.

BACKGROUND OF THE INVENTION

1. Field of the Invention

The present disclosure relates to an electronic device and a manufacturing method thereof.

2. Description of the Related Art

In the related art, studies have been conducted on an electronic apparatus (also referred to as an "electronic element" or the like) having a structure in which an electronic component is mounted on a wiring board.

For example, JP2019-91866A discloses the following manufacturing method, as a method of manufacturing an electronic element that has a sufficient electromagnetic wave shielding effect, can easily remove heat generation from an electronic component, and can be made thinner.

The manufacturing method for an electronic element disclosed in JP2019-91866A is a manufacturing method of an electronic element including an electronic substrate including a wiring board having a mounting surface, and a plurality of electronic components mounted on the mounting surface of the wiring board, an insulating protective layer that is provided on the electronic substrate and includes the electronic components, an electromagnetic wave shielding layer that is provided on the insulating protective layer and includes the electronic components, and a ground section that grounds the electromagnetic wave shielding layer by contacting the electromagnetic wave shielding layer, the method comprising: a first step of forming the insulating protective layer from an insulating material; and a second step of forming the electromagnetic wave shielding layer on the insulating protective layer from a conductive material.

SUMMARY OF THE INVENTION

The present inventor has studied manufacturing an electronic device by forming, on an electronic substrate comprising a wiring board having a mounting surface, a ground electrode that defines a ground region on the mounting surface, and an electronic component that is located on the mounting surface and is disposed in the ground region, an insulating protective layer that is disposed in the ground region and covers the electronic component and an electromagnetic wave shielding layer that extends over the insulating protective layer and the ground electrode and that covers the insulating protective layer and is electrically connected to the ground electrode. Further, from the viewpoint of simplification of a manufacturing process and a manufacturing apparatus, the present inventor has studied forming the electromagnetic wave shielding layer by a liquid process using an ink for forming an electromagnetic wave shielding layer instead of a vapor phase process (for example, sputtering, vapor deposition, or chemical vapor deposition).

However, as a result of these studies, it was found that, in a case in which the electromagnetic wave shielding layer is formed by a liquid process, durability of the electromagnetic wave shielding layer may be lowered.

An object of one aspect of the present disclosure is to provide an electronic device excellent in durability of an electromagnetic wave shielding layer formed using an ink for forming an electromagnetic wave shielding layer, and a manufacturing method thereof.

The specific methods for achieving the above-described object include the following aspects.

<1> An electronic device comprising: a wiring board having a mounting surface; a ground electrode that defines a ground region on the mounting surface; an electronic component that is located on the mounting surface and is disposed in the ground region; an insulating protective layer that is disposed in the ground region and covers the electronic component; and an electromagnetic wave shielding layer that is provided to extend over the insulating protective layer and the ground electrode and that covers the insulating protective layer and is electrically connected to the ground electrode, the electromagnetic wave shielding layer being a solidified product of an ink for forming an electromagnetic wave shielding layer, in which a void ratio $S1$, which is a void ratio of a portion of the electromagnetic wave shielding layer located on the ground electrode, is lower than a void ratio $S2$, which is a void ratio of a portion of the electromagnetic wave shielding layer located on the insulating protective layer.

<2> The electronic device according to <1>, in which a ratio of the void ratio $S2$ to the void ratio $S1$ is 1.10 or more.

<3> The electronic device according to <1> or <2>, in which a ratio of the void ratio $S2$ to the void ratio $S1$ is 1.20 or more.

<4> The electronic device according to any one of <1> to <3>, in which a ratio of the void ratio $S2$ to the void ratio $S1$ is less than 2.00.

<5> The electronic device according to any one of <1> to <4>, in which the void ratio $S2$ is 25.0% or less.

<6> A manufacturing method of an electronic device, the method comprising: a preparation step of preparing an electronic substrate including a wiring board having a mounting surface, a ground electrode that defines a ground region on the mounting surface, and an electronic component that is located on the mounting surface and is disposed in the ground region; a first step of forming an insulating protective layer that covers the electronic component in the ground region; and a second step of forming an electromagnetic wave shielding layer that extends over the insulating protective layer and the ground electrode and that covers the insulating protective layer and is electrically connected to the ground electrode, the electromagnetic wave shielding layer being a solidified product of an ink for forming an electromagnetic wave shielding layer, in which a void ratio $S1$, which is a void ratio of a portion located on the ground electrode, is lower than a void ratio $S2$, which is a void ratio of a portion located on the insulating protective layer, in which the second step includes applying a first ink for forming an electromagnetic wave shielding layer to a region that extends over the insulating protective layer and the ground electrode and sintering the first ink for forming an electromagnetic wave shielding layer to form a first layer, and applying a second ink for forming an electromagnetic wave shielding layer onto the ground electrode and sintering the second ink for forming an electromagnetic wave shielding layer to form a second layer, in which a portion of the first layer located on the ground electrode and the second layer are formed in a mutually laminated disposition, and at least one of a sintering temperature for forming the second layer being higher than a sintering temperature for forming the first layer or a sintering time for forming the second layer being longer than a sintering time for forming the first layer is satisfied.

<7> The manufacturing method of an electronic device according to <6>, in which the application of the first ink for forming an electromagnetic wave shielding layer in the formation of the first layer and the application of the second ink for forming an electromagnetic wave shielding layer in the formation of the second layer are each performed by using an ink jet recording method, a dispenser method, or a spray method.

<8> The manufacturing method of an electronic device according to <6> or <7>, in which, in the first step, an ink for forming an insulating protective layer is applied by an ink jet recording method, a dispenser method, or a spray method to form the insulating protective layer.

According to one aspect of the present disclosure, there are provided an electronic device excellent in durability of an electromagnetic wave shielding layer formed using an ink for forming an electromagnetic wave shielding layer, and a manufacturing method thereof.

DESCRIPTION OF THE PREFERRED EMBODIMENTS

Figure 1A:
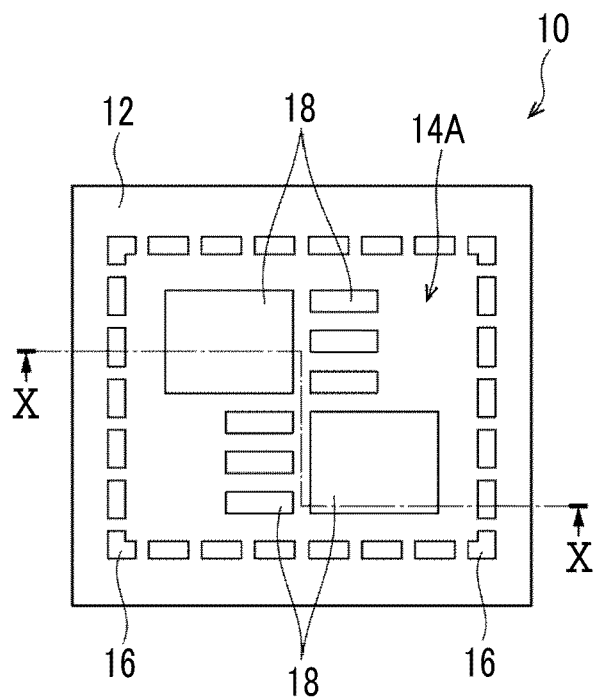
FIG. 1A is a schematic plan view of an electronic substrate prepared in a preparation step in a manufacturing method according to an embodiment of the present disclosure.

In the present disclosure, a numerical range shown using "to" indicates a range including the numerical values described before and after "to" as a lower limit and an upper limit.

In the present disclosure, in a case in which a plurality of substances corresponding to respective components in a composition are present, the amount of the respective components in the composition indicates the total amount of the plurality of substances present in the composition unless otherwise specified.

In a numerical range described in a stepwise manner in the present disclosure, an upper limit or a lower limit described in a certain numerical range may be replaced with an upper limit or a lower limit in another numerical range described in a stepwise manner or a value described in an example.

In the present disclosure, the term "step" denotes not only an individual step but also a step which is not clearly distinguishable from another step as long as an effect expected from the step can be achieved.

In the present disclosure, a combination of preferred aspects is a more preferred embodiment.

[Electronic Device]

According to the present disclosure, there is provided an electronic device comprising: a wiring board having a mounting surface; a ground electrode that defines a ground region on the mounting surface; an electronic component that is located on the mounting surface and is disposed in the ground region; an insulating protective layer that is disposed in the ground region and covers the electronic component; and an electromagnetic wave shielding layer that is provided to extend over the insulating protective layer and the ground electrode and that covers the insulating protective layer and is electrically connected to the ground electrode, the electromagnetic wave shielding layer being a solidified product of an ink for forming an electromagnetic wave shielding layer, in which a void ratio S1, which is a void ratio of a portion of the electromagnetic wave shielding layer located on the ground electrode, is lower than a void ratio S2, which is a void ratio of a portion of the electromagnetic wave shielding layer located on the insulating protective layer.

According to the electronic device of the present disclosure, durability of the electromagnetic wave shielding layer formed using the ink for forming an electromagnetic wave shielding layer is improved.

The reason why such an effect is exhibited is considered to be that the void ratio S1 of the portion of the electromagnetic wave shielding layer located on the ground electrode is low to some extent (that is, a density is high to some extent), thereby improving the durability (that is, connection reliability with the ground electrode) of the portion of the electromagnetic wave shielding layer. Further, the reason is considered to be that the void ratio S2 of the portion of the electromagnetic wave shielding layer located on the insulating protective layer is high to some extent, thereby reducing damage to the electromagnetic wave shielding layer on the insulating protective layer, which is caused by a difference in stress between the insulating protective layer and the electromagnetic wave shielding layer (that is, improving the durability of the electromagnetic wave shielding layer on the insulating protective layer).

In the present disclosure, the term "conductive" means properties of having a volume resistivity of less than $10^8$ $\Omega$cm.

In the present disclosure, the insulating properties mean properties of having a volume resistivity of $10^{10}$ $\Omega$cm or more.

<Embodiment of Manufacturing Method of Electronic Device>

Hereinafter, an embodiment of a manufacturing method of an electronic device of the present disclosure will be shown. A method for manufacturing the electronic device of the present disclosure is not limited to the following embodiments.

A manufacturing method according to the present embodiment includes: a preparation step of preparing an electronic substrate including a wiring board having a mounting surface, a ground electrode that defines a ground region on the mounting surface, and an electronic component that is located on the mounting surface and is disposed in the ground region; a first step of forming an insulating protective layer that covers the electronic component in the ground region; and a second step of forming an electromagnetic wave shielding layer that extends over the insulating protective layer and the ground electrode and that covers the insulating protective layer and is electrically connected to the ground electrode, in which a void ratio $S1$, which is a void ratio of a portion located on the ground electrode, is lower than a void ratio $S2$, which is a void ratio of a portion located on the insulating protective layer.

The second step in the manufacturing method according to the present embodiment includes applying a first ink for forming an electromagnetic wave shielding layer to a region that extends over the insulating protective layer and the ground electrode and sintering the first ink for forming an electromagnetic wave shielding layer to form a first layer, and applying a second ink for forming an electromagnetic wave shielding layer onto the ground electrode and sintering the second ink for forming an electromagnetic wave shielding layer to form a second layer, in which a portion of the first layer located on the ground electrode and the second layer are formed in a mutually laminated disposition, and at least one of a sintering temperature for forming the second layer being higher than a sintering temperature for forming the first layer or a sintering time for forming the second layer being longer than a sintering time for forming the first layer is satisfied.

The manufacturing method according to the present embodiment may include other steps as necessary.

In the manufacturing method according to the present embodiment, in the second step, the first layer is formed in the region that extends over the insulating protective layer and the ground electrode and the second layer is formed on the ground electrode, to form the electromagnetic wave shielding layer. Here, a portion of the first layer located on the ground electrode and the second layer are formed in a mutually laminated disposition.

Either of the first layer and the second layer may be formed first.

The portion of the electromagnetic wave shielding layer located on the ground electrode is formed by the first layer and the second layer. In the portion of the electromagnetic wave shielding layer located on the ground electrode, a laminated structure of the first layer and the second layer may be maintained as it is, or the first layer and the second layer may be fused and integrated. In a case in which the laminated structure of the first layer and the second layer is maintained as it is, an interface between the first layer and the second layer may be clear or may not be clear.

The portion of the electromagnetic wave shielding layer located on the insulating protective layer is formed by a portion of the first layer located on the insulating protective layer.

In the manufacturing method according to the present embodiment, at least one of the sintering temperature for forming the second layer on the ground electrode being higher than the sintering temperature for forming the first layer in the region that extends over the insulating protective layer and the ground electrode or the sintering time for forming the second layer being longer than the sintering time for forming the first layer is satisfied, whereby the void ratio $S1$, which is the void ratio of the portion located on the ground electrode, can be made lower than the void ratio $S2$, which is the void ratio of the portion located on the insulating protective layer, in the obtained electromagnetic wave shielding layer.

Therefore, according to the manufacturing method according to the present embodiment, it is possible to manufacture an electronic device in which a decrease in connection reliability between the electromagnetic wave shielding layer formed by using the ink for forming an electromagnetic wave shielding layer and the ground electrode is suppressed.

Hereinafter, an example of the manufacturing method of an electronic device according to an embodiment of the present disclosure will be described with reference to the drawings. Note that the manufacturing method of an electronic device according to the embodiment of the present disclosure is not limited to the following example.

In the following description, substantially the same elements (for example, components or parts) may be designated by the same reference numerals, and redundant description thereof may be omitted.

Figure 1B:
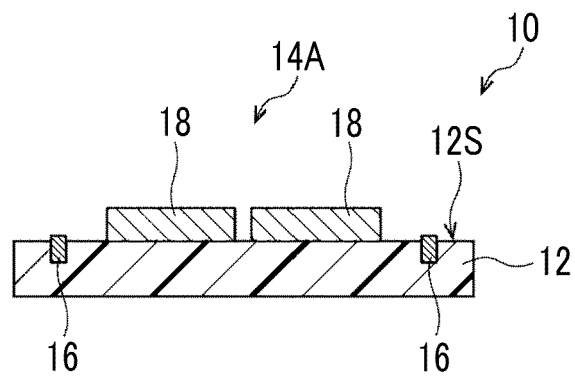
FIG. 1B is a cross-sectional view taken along the line X-X of FIG. 1A.

FIG. 1A is a schematic plan view of the electronic substrate prepared in the preparation step, and FIG. 1B is a cross-sectional view taken along the line X-X of FIG. 1A.

Figure 2A:
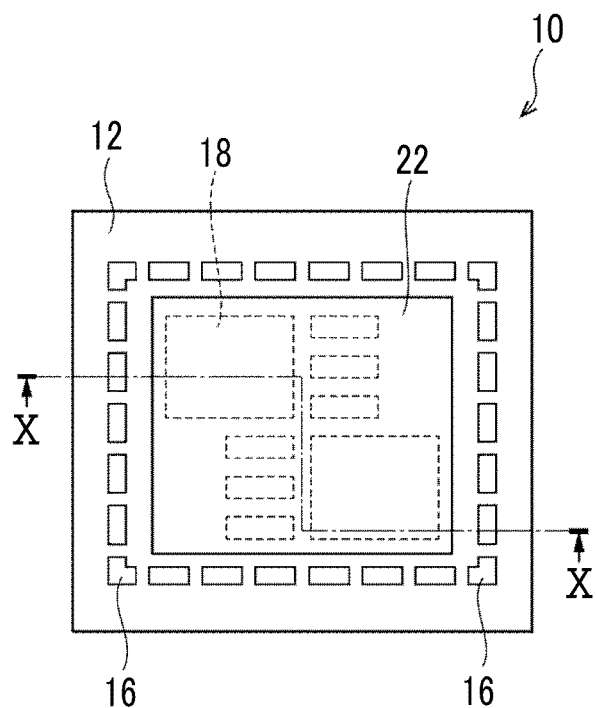
FIG. 2A is a schematic plan view of an electronic substrate on which an insulating protective layer is formed in a first step in the manufacturing method according to the embodiment of the present disclosure.
Figure 2B:
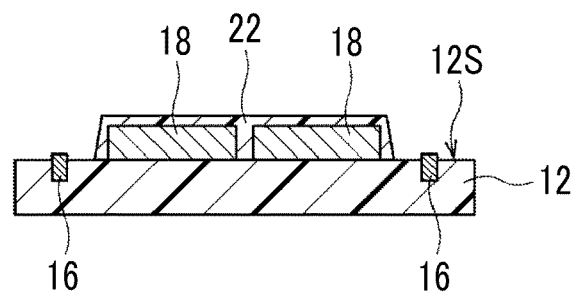
FIG. 2B is a cross-sectional view taken along the line X-X of FIG. 2A.

FIG. 2A is a schematic plan view of the electronic substrate on which the insulating protective layer is formed in the first step, and FIG. 2B is a cross-sectional view taken along the line X-X of FIG. 2A.

Figure 3A:
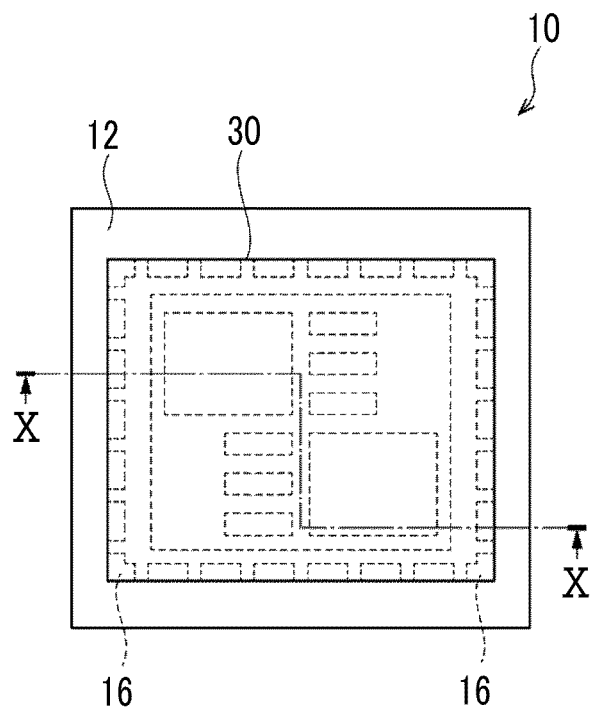
FIG. 3A is a schematic plan view of an electronic substrate having a first layer formed in a second step of forming an electromagnetic wave shielding layer in the manufacturing method according to the embodiment of the present disclosure.
Figure 3B:
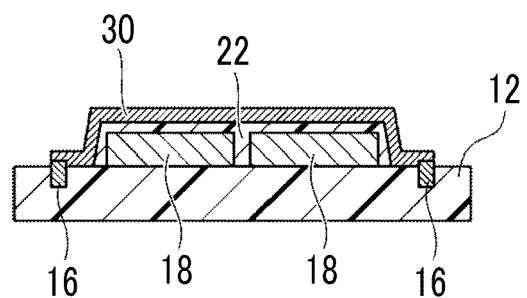
FIG. 3B is a cross-sectional view taken along the line X-X of FIG. 3A.

FIG. 3A is a schematic plan view of the electronic substrate having the first layer formed in the second step, and FIG. 3B is a cross-sectional view taken along the line X-X of FIG. 3A.

Figure 4A:
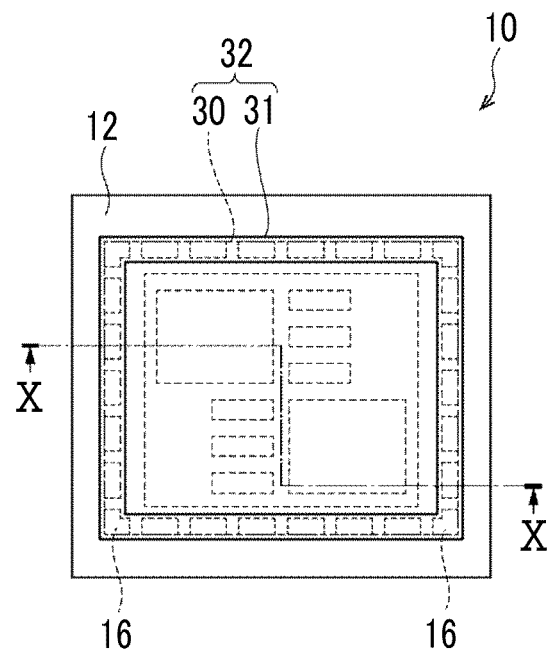
FIG. 4A is a schematic plan view of an electronic substrate having a second layer formed in the second step of forming the electromagnetic wave shielding layer in the manufacturing method according to the embodiment of the present disclosure.
Figure 4B:
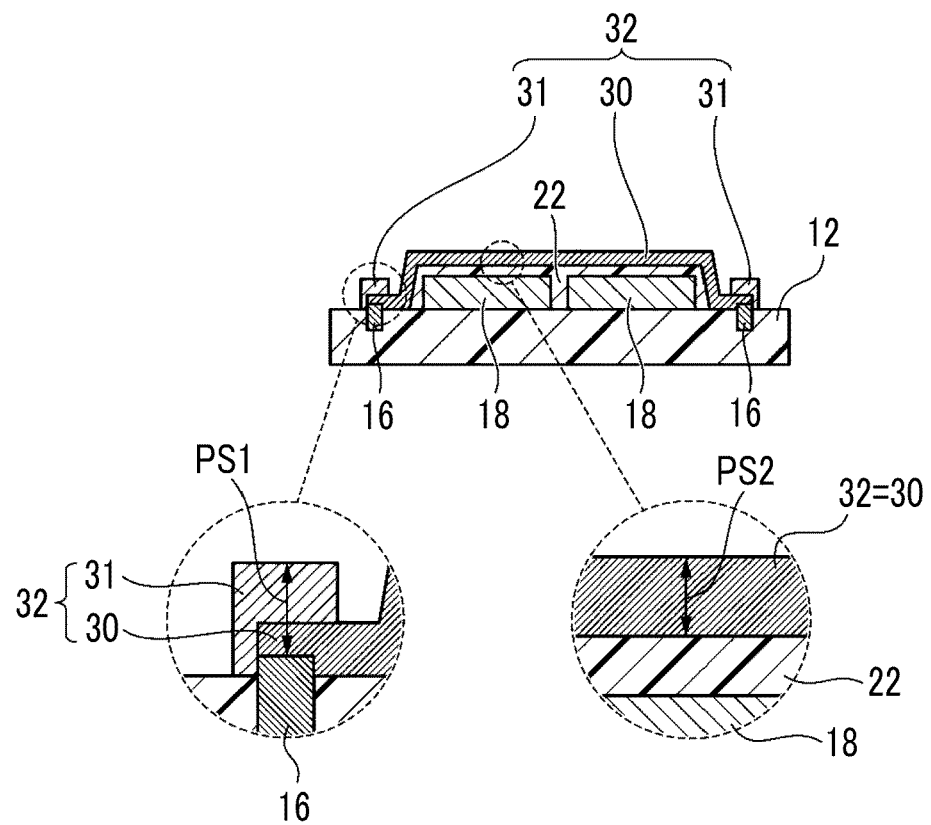
FIG. 4B is a cross-sectional view taken along the line X-X of FIG. 4A.

FIG. 4A is a schematic plan view of the electronic substrate having the second layer formed in the second step, and FIG. 4B is a cross-sectional view taken along the line X-X of FIG. 4A.

-Preparation Step-

As shown in FIGS. 1A and 1B, in the preparation step in the present example, an electronic substrate 10 comprising a wiring board 12 having a mounting surface 12S, a ground electrode 16 that defines a ground region 14A on the mounting surface 12S, and an electronic component 18 that is located on the mounting surface 12S and is disposed in the ground region 14A.

The preparation step may be a step of simply preparing the electronic substrate 10 manufactured in advance, or may be a step of manufacturing the electronic substrate 10.

As a manufacturing method of the electronic substrate 10, for example, a known manufacturing method of an electronic substrate in which an electronic component is mounted on a printed wiring board can be appropriately referred to.

As the wiring board 12, a substrate on which a wiring is formed, for example, a printed wiring board can be used.

The wiring board 12 may include an electrode other than the ground electrode 16, a solder resist layer, and the like.

The ground electrode 16 is an electrode to which a ground (GND) potential is applied.

In this example, a plurality of the electronic components 18 are mounted in the ground region 14A defined by the ground electrode 16.

In this example, a conductive component may be mounted outside the ground region 14A. Examples of the conductive component include an electronic component, an electrode, and a wiring.

As shown in FIG. 1A, the ground electrode 16 in this example is formed in a discontinuous pattern (specifically, a divided line pattern, in other words, a dotted pattern), but the ground electrode in the present disclosure is not limited to this example. For example, the ground electrode in the present disclosure may be formed as a continuous pattern (that is, a line pattern that is not divided).

In addition, the ground electrode 16 in this example is formed as a frame-shaped pattern that completely goes around the plurality of electronic components 18.

However, the ground electrode 16 in the present disclosure is not limited to the frame-shaped pattern, and need only have a pattern (for example, a U-shaped pattern) capable of defining the ground region 14A.

From the viewpoint of further reducing an influence of the electromagnetic waves from the outside on the plurality of electronic components 18, the ground electrode 16 preferably surrounds a region where the plurality of electronic components are disposed by half or more, and more preferably surrounds the region by ¾ or more.

The ground region 14A is a region defined by the ground electrode 16.

In a case in which the pattern of the ground electrode 16 is a continuous frame-shaped pattern, the ground region 14A is a region surrounded by the ground electrode 16.

In a case in which the pattern of the ground electrode 16 is a discontinuous frame-shaped pattern, the ground region 14A is a region surrounded by an imaginary frame line formed by connecting discontinuous (for example, a dotted line-shaped and/or U-shaped pattern) ground electrodes 16.

In addition, as shown in FIG. 1B, the ground electrode 16 in this example is formed such that a part of the ground electrode 16 in a thickness direction is embedded in the wiring board 12, but the ground electrode in the present disclosure is not limited to this example. For example, the ground electrode in the present disclosure may be formed such that the entirety of the ground electrode in the thickness direction is embedded. In addition, the ground electrode in the present disclosure may be formed on a surface of the wiring board 12 instead of being embedded in the wiring board 12. In addition, the ground electrode in the present disclosure may be formed as a pattern that penetrates the wiring board 12.

The plurality of electronic components 18 mounted in the ground region 14A may be electronic components having the same design or may be electronic components having different designs. In addition, the number of the electronic components mounted in the ground region is not limited to plural, and may be only one.

Examples of the electronic component 18 include a semiconductor chip such as an integrated circuit (IC), a capacitor, and a transistor.

-First Step-

As shown in FIGS. 2A and 2B, in the first step, an insulating protective layer 22 that covers the plurality of electronic components 18 mounted in the ground region 14A is formed.

The insulating protective layer 22 is formed in a region that extends over the plurality of electronic components 18 and a periphery of the plurality of electronic components 18 in the ground region 14A.

The function of the insulating protective layer is, for example, a function of protecting the electronic components and a function of suppressing a short-circuit between the electronic components and other conductive components (for example, an electromagnetic wave shielding layer).

In the first step, for example, an ink for forming an insulating protective layer is applied by an ink jet recording method, a dispenser method, or a spray method to form the insulating protective layer 22.

The ink for forming an insulating protective layer is preferably an active energy ray curable-type ink.

In a case in which the ink for forming an insulating protective layer is an active energy ray curable-type ink, it is advantageous from the viewpoint of productivity and durability of the insulating protective layer.

The first step is not limited to forming the insulating protective layer using the ink for forming an insulating protective layer.

The insulating protective layer may be formed of, for example, a sheet material.

For the sheet material, for example, an insulating sheet material disclosed in JP2019-91866A can be referred to.

-Second Step-

As shown in FIGS. 3A, 3B, 4A, and 4B, in the second step, a first layer 30 and a second layer 31 are formed in this order to form an electromagnetic wave shielding layer 32.

As a result, the electronic device according to the present embodiment is obtained.

In this example, the first layer 30 is formed first and then the second layer 31 is formed, but the formation order may be reversed (that is, the second layer 31 may be formed first and then the first layer 30 may be formed).

The electromagnetic wave shielding layer 32 is a layer for reducing the influence of electromagnetic waves on the electronic components 18 by shielding the electromagnetic waves applied to the electronic components 18.

In the present disclosure, the performance of such an electromagnetic wave shielding layer 32 is also referred to as "electromagnetic wave-shielding properties".

The electromagnetic wave-shielding properties of the electromagnetic wave shielding layer 32 are exhibited by disposing the electromagnetic wave shielding layer 32 on the electronic components 18 with the insulating protective layer 22 being interposed therebetween.

In addition, the electromagnetic wave-shielding properties of the electromagnetic wave shielding layer 32 are exhibited in a case in which a ground (GND) potential is applied to the electromagnetic wave shielding layer 32. Therefore, the electromagnetic wave shielding layer 32 has conductivity as a premise of the electromagnetic wave-shielding properties.

The second step includes applying the first ink for forming an electromagnetic wave shielding layer to a region that extends over the insulating protective layer 22 and the ground electrode 16 and sintering the first ink for forming an electromagnetic wave shielding layer to form the first layer 30 (see FIGS. 3A and 3B), and applying the second ink for forming an electromagnetic wave shielding layer onto the ground electrode 16 and sintering the second ink for forming an electromagnetic wave shielding layer to form the second layer 31 (see FIGS. 4A and 4B).

A portion of the first layer 30 located on the ground electrode 16 and the second layer 31 are formed in a mutually laminated disposition.

The first ink for forming an electromagnetic wave shielding layer and the second ink for forming an electromagnetic wave shielding layer may be the same ink or different inks.

The sintering of the first ink for forming an electromagnetic wave shielding layer is performed, for example, by at least one of heating the first ink for forming an electromagnetic wave shielding layer or irradiating the first ink for forming an electromagnetic wave shielding layer with active energy rays (for example, infrared rays, visible rays, or ultraviolet rays). The same applies to the sintering of the second ink for forming an electromagnetic wave shielding layer.

In the second step, at least one of the sintering temperature for forming the second layer 31 being higher than the sintering temperature for forming the first layer 30 or the sintering time for forming the second layer 31 being longer than the sintering time for forming the first layer 30 is satisfied.

As a result, in the obtained electromagnetic wave shielding layer 32, the void ratio S1, which is a void ratio of a portion PS1 (see FIG. 4B) located on the ground electrode 16, can be set to be made lower than the void ratio S2, which is a void ratio of a portion PS2 (see FIG. 4B) located on the insulating protective layer 22.

As described above, in the electronic device obtained in the second step, the void ratio S1, which is the void ratio of the portion PS1 of the electromagnetic wave shielding layer 32 located on the ground electrode 16, is lower than the void ratio S2, which is the void ratio of the portion PS2 of the electromagnetic wave shielding layer 32 located on the insulating protective layer 22.

As a result, a decrease in connection reliability between the electromagnetic wave shielding layer 32 formed by using the ink for forming an electromagnetic wave shielding layer and the ground electrode 16 is suppressed.

In FIG. 4B, the portion PS1 of the electromagnetic wave shielding layer 32 located on the ground electrode 16 is a portion where the void ratio S1 is measured. A range of the portion PS1 in a film thickness direction is a range from a surface of the ground electrode 16 to a surface of the second layer 31 (that is, a total range of the first layer 30 and the second layer 31). A range of the portion PS1 in a direction orthogonal to the film thickness direction need only be a range that can be observed with a scanning electron microscope (SEM).

The portion PS2 of the electromagnetic wave shielding layer 32 located on the insulating protective layer 22 is a portion where the void ratio S2 is measured. A range of the portion PS2 in the film thickness direction is a range from the surface of the insulating protective layer 22 to a surface of the electromagnetic wave shielding layer 32 (that is, a range of the first layer 30 in the film thickness direction). On the insulating protective layer 22, the first layer 30 is the same as the electromagnetic wave shielding layer 32. A range of the portion PS2 in the direction orthogonal to the film thickness direction need only be a range that can be observed with a scanning electron microscope (SEM).

A specific method of measuring the void ratio S1 and the void ratio S2 will be described below.

As shown in FIG. 4B, the portion PS1 of the formed electromagnetic wave shielding layer 32 located on the ground electrode 16 (that is, the portion where the void ratio S1 is measured) is formed of the second layer 31 and a portion of the first layer 30 on the ground electrode 16.

In the electromagnetic wave shielding layer 32, the second layer 31 and the portion of the first layer 30 on the ground electrode 16 may maintain a laminated structure, and both of them may be integrated to form the "the portion PS1 of electromagnetic wave shielding layer 32 located on the ground electrode 16".

In a case in which the laminated structure of the first layer 30 and the second layer 31 is maintained as it is, an interface between the first layer 30 and the second layer 31 may be clear or may not be clear.

Hereinafter, preferred ranges of the electronic device and the manufacturing method of the electronic device of the present disclosure will be described.

<Ratio of Void Ratio S2 to Void Ratio S1 ("S2/S1")>

In the present disclosure, a ratio of the void ratio S2 to the void ratio S1 (hereinafter, also referred to as an "S2/S1 ratio" or "S2/S1") is preferably 1.10 or more, more preferably 1.20 or more, and still more preferably 1.25 or more. In a case in which the S2/S1 ratio is 1.10 or more, the durability of the electromagnetic wave shielding layer is further improved.

The S2/S1 ratio is preferably less than 2.00, more preferably 1.90 or less, and still more preferably 1.80 or less.

In a case in which the S2/S1 ratio is less than 2.00, the durability of the electromagnetic wave shielding layer is further improved.

In the present disclosure, the void ratio (that is, the void ratio S1 or the void ratio S2) means a value measured by the following method.

That is, a scanning electron microscope image of a cross section parallel to a thickness direction of the electromagnetic wave shielding layer is acquired.

The obtained scanning electron microscope image is binarized using image software ("Adobe Photoshop" manufactured by Adobe Systems, Inc.) into a white region where a conductive substance is present and a black region where a void is present.

The void ratio is obtained as a proportion of an area of the black region with respect to a total area of the white region and the black region.

A sample is cut to obtain the cross section, for example, using a microtome (for example, trade name RM2255 manufactured by Leica Co., Ltd.).

The acquisition of the scanning electron microscope image is performed using a scanning electron microscope (for example, trade name S-4700 manufactured by Hitachi High-Tech Corporation.).

The void ratio S2 is preferably 25.0% or less, more preferably 20.0% or less, still more preferably 18.0% or less, and still more preferably 15.0% or less.

In a case in which the void ratio S2 is 25.0% or less, the electromagnetic wave-shielding properties of the electromagnetic wave shielding layer is further improved.

Although a lower limit of the void ratio S2 is not particularly limited, it is preferably 3.0% or more and more preferably 5.0% or more, from the viewpoint of the manufacturing suitability of the electromagnetic wave shielding layer.

The void ratio S1 is preferably 15.0% or less, and more preferably 12.0% or less.

In a case in which the void ratio S1 is 15.0% or less, the durability (that is, the connection reliability) of the electromagnetic wave shielding layer on the ground electrode is further improved.

Although a lower limit of the void ratio S1 is not particularly limited, it is preferably 3.0% or more and more preferably 5.0% or more, from the viewpoint of the manufacturing suitability of the electromagnetic wave shielding layer.

Next, preferred aspects of the ink for forming an electromagnetic wave shielding layer, the method for forming an electromagnetic wave shielding layer, the ink for forming an insulating protective layer, and a method for forming an insulating protective layer will be described.

<Ink for Forming Electromagnetic Wave Shielding Layer>

The electromagnetic wave shielding layer in the present disclosure is a solidified product of the ink for forming an electromagnetic wave shielding layer.

That is, the electromagnetic wave shielding layer in the present disclosure is formed by applying the ink for forming an electromagnetic wave shielding layer and solidifying the ink for forming an electromagnetic wave shielding layer.

In the manufacturing method according to the above-described embodiment, the first layer is formed using the first ink for forming an electromagnetic wave shielding layer and the second layer is formed using the second ink for forming an electromagnetic wave shielding layer, to form the electromagnetic wave shielding layer.

The first ink for forming an electromagnetic wave shielding layer and the second ink for forming an electromagnetic wave shielding layer may be the same ink or different inks.

Hereinafter, the first ink for forming an electromagnetic wave shielding layer and the second ink for forming an electromagnetic wave shielding layer may be referred to as a first ink and a second ink, respectively.

Hereinafter, preferred aspects of the ink for forming an electromagnetic wave shielding layer (for example, the first ink and the second ink) will be described.

As the ink for forming an electromagnetic wave shielding layer, an ink containing metal particles (hereinafter, also referred to as a "metal particle ink"), an ink containing a metal complex (hereinafter, also referred to as a "metal complex ink"), or an ink containing a metal salt (hereinafter, also referred to as a "metal salt ink") is preferable, and a metal salt ink or a metal complex ink is more preferable.

(Metal Particle Ink)

The metal particle ink is, for example, an ink composition obtained by dispersing metal particles in a dispersion medium.

-Metal Particles-

Examples of the metal constituting the metal particles include base metal and noble metal particles. Examples of the base metal include nickel, titanium, cobalt, copper, chromium, manganese, iron, zirconium, tin, tungsten, molybdenum, and vanadium. Examples of the noble metal include gold, silver, platinum, palladium, iridium, osmium, ruthenium, rhodium, rhenium, and alloys containing these metals. Among these, from the viewpoint of the electromagnetic wave-shielding properties, the metal constituting the metal particles preferably includes at least one selected from the group consisting of silver, gold, platinum, nickel, palladium, and copper, and more preferably includes silver.

An average particle diameter of the metal particles is not particularly limited, but is preferably 10 nm to 500 nm, and more preferably 10 nm to 200 nm. In a case in which the average particle diameter is in the above range, a baking temperature of the metal particles is lowered, which improves process suitability for forming the electromagnetic wave shielding layer. Particularly, in a case in which the metal particle ink is applied by using a spray method or an ink jet recording method, jettability is improved, which tends to improve pattern forming properties and film thickness uniformity of the electromagnetic wave shielding layer. The average particle diameter mentioned herein means an average value of primary particle diameters of the metal particles (average primary particle diameter).

The average particle diameter of the metal particles is measured by a laser diffraction/scattering method. The average particle diameter of the metal particles is, for example, a value obtained by measuring a 50% cumulative volume-based diameter (D50) three times and calculating an average value of D50 measured three times, and can be measured by using a laser diffraction/scattering-type particle size distribution analyzer (trade name "LA-960" manufactured by Horiba, Ltd.).

In addition, the metal particle ink may contain metal particles having an average particle diameter of 500 nm or more, as necessary. In a case in which the metal particle ink contains metal particles having an average particle diameter of 500 nm or more, a melting point of the nm-sized metal particles is lowered around the μm-sized metal particles, which makes it possible to bond the electromagnetic wave shielding layer.

The content of the metal particles in the metal particle ink is preferably 10% by mass to 90% by mass, and more preferably 20% by mass to 50% by mass, with respect to the total amount of the metal particle ink. In a case in which the content of the metal particles is 10% by mass or more, a surface resistivity is further reduced. In a case in which the content of the metal particles is 90% by mass or less, jettability is improved in a case in which the metal particle ink is applied by using an ink jet recording method.

In addition to the metal particles, the metal particle ink may contain, for example, a dispersing agent, a resin, a dispersion medium, a thickener, and a surface tension adjuster.

-Dispersing Agent-

The metal particle ink may contain a dispersing agent that adheres to at least a part of a surface of the metal particles. The dispersing agent substantially constitutes metal colloidal particles, together with the metal particles. The dispersing agent has an action of coating the metal particles to improve dispersibility of the metal particles and prevent aggregation. The dispersing agent is preferably an organic compound capable of forming the metal colloidal particles. From the viewpoint of the electromagnetic wave-shielding properties and dispersion stability, the dispersing agent is preferably an amine, a carboxylic acid, an alcohol, or a resin dispersing agent.

The metal particle ink may contain one dispersing agent or two or more dispersing agents.

Examples of the amine include saturated or unsaturated aliphatic amines. Among these, the amine is preferably an aliphatic amine having 4 to 8 carbon atoms. The aliphatic amine having 4 to 8 carbon atoms may be linear or branched, or may have a ring structure.

Examples of the aliphatic amine include butylamine, normal pentylamine, isopentylamine, hexylamine, 2-ethylhexylamine, and octylamine.

Examples of the amine having an alicyclic structure include cycloalkylamines such as cyclopentylamine and cyclohexylamine.

Examples of an aromatic amine include aniline.

The amine may have a functional group other than an amino group. Examples of the functional group other than an amino group include a hydroxy group, a carboxy group, an alkoxy group, a carbonyl group, an ester group, and a mercapto group.

Examples of the carboxylic acid include formic acid, oxalic acid, acetic acid, hexanoic acid, acrylic acid, octylic acid, oleic acid, tianshic acid, ricinoleic acid, gallic acid, and salicylic acid. A carboxy group, which is a part of the carboxylic acid, may form a salt with a metal ion. The salt may be formed of one metal ion or two or more metal ions.

The carboxylic acid may have a functional group other than the carboxy group. Examples of the functional group other than the carboxy group include an amino group, a hydroxy group, an alkoxy group, a carbonyl group, an ester group, and a mercapto group.

Examples of the alcohol include a terpene-based alcohol, an allyl alcohol, and an oleyl alcohol. The alcohol is likely to be coordinated with the surface of the metal particles, and can suppress the aggregation of the metal particles.

Examples of the resin dispersing agent include a dispersing agent that has a nonionic group as a hydrophilic group and can be uniformly dissolved in a solvent. Examples of the resin dispersing agent include polyvinylpyrrolidone, polyethylene glycol, a polyethylene glycol-polypropylene glycol copolymer, polyvinyl alcohol, polyallylamine, and a polyvinyl alcohol-polyvinyl acetate copolymer. A molecular weight of the resin dispersing agent is preferably 1000 to 50000, and more preferably 1000 to 30000, in terms of a weight-average molecular weight.

The content of the dispersing agent in the metal particle ink is preferably 0.5% by mass to 50% by mass, and more preferably 1% by mass to 30% by mass, with respect to the total amount of the metal particle ink.

-Dispersion Medium-

The metal particle ink preferably contains a dispersion medium. A type of the dispersion medium is not particularly limited, and examples thereof include a hydrocarbon, an alcohol, and water.

The metal particle ink may contain one dispersion medium or two or more dispersion media. The dispersion medium contained in the metal particle ink is preferably volatile. A boiling point of the dispersion medium is preferably 50° C. to 250° C., more preferably 70° C. to 220° C., and still more preferably 80° C. to 200° C. In a case in which the boiling point of the dispersion medium is 50° C. to 250° C., the stability and baking properties of the metal particle ink tend to be simultaneously achieved.

Examples of the hydrocarbon include an aliphatic hydrocarbon and an aromatic hydrocarbon.

Examples of the aliphatic hydrocarbon include a saturated or unsaturated aliphatic hydrocarbon such as tetradecane, octadecane, heptamethylnonane, tetramethylpentadecane, hexane, heptane, octane, nonane, decane, tridecane, methylpentane, normal paraffin, or isoparaffin.

Examples of the aromatic hydrocarbon include toluene and xylene.

Examples of the alcohol include an aliphatic alcohol and an alicyclic alcohol. In a case in which an alcohol is used as the dispersion medium, the dispersing agent is preferably an amine or a carboxylic acid.

Examples of the aliphatic alcohol include a saturated or unsaturated aliphatic alcohol having 6 to 20 carbon atoms that may contain an ether bond in a chain, such as heptanol, octanol (for example, 1-octanol, 2-octanol, or 3-octanol), decanol (for example, 1-decanol), lauryl alcohol, tetradecyl alcohol, cetyl alcohol, 2-ethyl-1-hexanol, octadecyl alcohol, hexadecenol, and oleyl alcohol.

Examples of the alicyclic alcohol include a cycloalkanol such as cyclohexanol; a terpene alcohol such as terpineol (including α, β, and γ isomers, or any mixture of these) or dihydroterpineol; dihydroterpineol, myrtenol, sobrerol, menthol, carveol, perillyl alcohol, pinocarveol, and verbenol.

The dispersion medium may be water. From the viewpoint of adjusting physical properties such as viscosity, surface tension, and volatility, the dispersion medium may be a mixed solvent of water and another solvent. Another solvent to be mixed with water is preferably an alcohol. The alcohol used together with water is preferably an alcohol that is miscible with water and has a boiling point of 130° C. or lower. Examples of the alcohol include 1-propanol, 2-propanol, 1-butanol, 2-butanol, tert-butanol, 1-pentanol, ethylene glycol monomethyl ether, ethylene glycol monoethyl ether, ethylene glycol monopropyl ether, propylene glycol monomethyl ether.

The content of the dispersion medium in the metal particle ink is preferably 1% by mass to 50% by mass, with respect to the total amount of the metal particle ink. In a case in which the content of the dispersion medium is 1% by mass to 50% by mass, the metal particle ink can obtain sufficient conductivity as the ink for forming an electromagnetic wave shielding layer. The content of the dispersion medium is more preferably 10% by mass to 45% by mass, and still more preferably 20% by mass to 40% by mass.

-Resin-

The metal particle ink may contain a resin. Examples of the resin include polyester, polyurethane, a melamine resin, an acrylic resin, a styrene-based resin, a polyether, and a terpene resin.

The metal particle ink may contain one resin or two or more resins.

The content of the resin in the metal particle ink is preferably 0.1% by mass to 5% by mass with respect to the total amount of the metal particle ink.

-Thickener-

The metal particle ink may contain a thickener. Examples of the thickener include clay minerals such as clay, bentonite, and hectorite; cellulose derivatives such as methyl cellulose, carboxymethyl cellulose, hydroxyethyl cellulose, hydroxypropyl cellulose, and hydroxypropyl methyl cellulose; and polysaccharides such as xanthan gum and guar gum.

The metal particle ink may contain one thickener or two or more thickeners.

The content of the thickener in the metal particle ink is preferably 0.1% by mass to 5% by mass with respect to the total amount of the metal particle ink.

-Surfactant-

The metal particle ink may contain a surfactant. In a case in which the metal particle ink contains a surfactant, a uniform electromagnetic wave shielding layer is likely to be formed.

The surfactant may be any of an anionic surfactant, a cationic surfactant, or a nonionic surfactant. Among these, the surfactant is preferably a fluorine-based surfactant from the viewpoint of being able to adjust the surface tension with a small amount of content. In addition, the surfactant is preferably a compound having a boiling point higher than 250° C.

The viscosity of the metal particle ink is not particularly limited. The viscosity of the metal particle ink need only be 0.01 Pa·s to 5000 Pa·s, and is preferably 0.1 Pa·s to 100 Pa·s. In a case in which the metal particle ink is applied by using a spray method or an ink jet recording method, the viscosity of the metal particle ink is preferably 1 mPa·s to 100 mPa·s, more preferably 2 mPa·s to 50 mPa·s, and still more preferably 3 mPa·s to 30 mPa·s.

The viscosity of the metal particle ink is a value measured at 25° C. by using a viscometer. The viscosity is measured using, for example, a VISCOMETER TV-22 type viscometer (manufactured by Toki Sangyo Co., Ltd.).

The surface tension of the metal particle ink is not particularly limited, and is preferably 20 mN/m to 45 mN/m and more preferably 25 mN/m to 40 mN/m.

The surface tension is a value measured at 25° C. by using a surface tension meter.

The surface tension of the metal particle ink is measured using, for example, DY-700 (manufactured by Kyowa Interface Science Co., Ltd.).

-Manufacturing Method of Metal Particles-

The metal particles may be a commercially available product or may be manufactured by a known method. Examples of a manufacturing method of the metal particles include a wet reduction method, a vapor phase method, and a plasma method. Preferred examples of the manufacturing method of the metal particles include a wet reduction method capable of manufacturing metal particles having an average particle diameter of 200 nm or less and having a narrow particle size distribution. Examples of the manufacturing method of the metal particles by a wet reduction method include the method disclosed in JP2017-37761A, WO2014-57633A, and the like, the method including: a step of mixing a metal salt with a reducing agent to obtain a complexing reaction solution; and a step of heating the complexing reaction solution to reduce metal ions in the complexing reaction solution and to obtain a slurry of metal nanoparticles.

In manufacturing the metal particle ink, a heat treatment may be performed such that the content of each component contained in the metal particle ink is adjusted to be in a predetermined range. The heat treatment may be performed under reduced pressure or under normal pressure. In a case in which the heat treatment is performed under normal pressure, the heat treatment may be performed in the atmospheric air or in an inert gas atmosphere.

(Metal Complex Ink)

The metal complex ink is, for example, an ink composition obtained by dissolving a metal complex in a solvent.

-Metal Complex-

Examples of metals constituting the metal complex include silver, copper, gold, aluminum, magnesium, tungsten, molybdenum, zinc, nickel, iron, platinum, tin, and lead. Among these, from the viewpoint of the electromagnetic wave-shielding properties, the metal constituting the metal complex preferably includes at least one selected from the group consisting of silver, gold, platinum, nickel, palladium, and copper, and more preferably includes silver.

The content of the metal contained in the metal complex ink is preferably 1% by mass to 40% by mass, more preferably 5% by mass to 30% by mass, and still more preferably 7% by mass to 20% by mass, with respect to the total amount of the metal complex ink, in terms of the metal element.

The metal complex can be obtained, for example, by reacting a metal salt with a complexing agent. Examples of a manufacturing method of the metal complex include a method of adding a metal salt and a complexing agent to an organic solvent and stirring the mixture for a predetermined time. The stirring method is not particularly limited, and can be appropriately selected from known methods such as a stirring method using a stirrer, a stirring blade, or a mixer, and a method of applying ultrasonic waves.

Examples of the metal salt include a metal oxide, thiocyanate, sulfide, chloride, cyanide, cyanate, carbonate, acetate, nitrate, nitrite, sulfate, phosphate, perchlorate, tetrafluoroborate, an acetyl acetonate complex salt, and carboxylate.

Examples of the complexing agent include an amine, an ammonium carbamate-based compound, an ammonium carbonate-based compound, an ammonium bicarbonate compound, and a carboxylic acid. Among these, from the viewpoint of the electromagnetic wave-shielding properties and stability of the metal complex, the complexing agent preferably includes at least one selected from the group consisting of an ammonium carbamate-based compound, an ammonium carbonate-based compound, an amine, and a carboxylic acid having 8 to 20 carbon atoms.

The metal complex has a structure derived from a complexing agent, and preferably has a structure derived from at least one selected from the group consisting of an ammonium carbamate-based compound, an ammonium carbonate-based compound, an amine, and a carboxylic acid having 8 to 20 carbon atoms.

Examples of the amine as a complexing agent include ammonia, a primary amine, a secondary amine, a tertiary amine, and a polyamine.

Examples of the primary amine having a linear alkyl group include methylamine, ethylamine, 1-propylamine, n-butylamine, n-pentylamine, n-hexylamine, heptylamine, octylamine, nonylamine, n-decylamine, undecylamine, dodecylamine, tridecylamine, tetradecylamine, pentadecylamine, hexadecylamine, heptadecylamine, and octadecylamine.

Examples of the primary amine having a branched alkyl group include isopropylamine, sec-butylamine, tert-butylamine, isopentylamine, 2-ethylhexylamine, and tert-octylamine.

Examples of the primary amine having an alicyclic structure include cyclohexylamine and dicyclohexylamine.

Examples of the primary amine having a hydroxyalkyl group include ethanolamine, diethanolamine, triethanolamine, N-methylethanolamine, propanolamine, isopropanolamine, dipropanolamine, diisopropanolamine, tripropanolamine, and triisopropanolamine.

Examples of the primary amine having an aromatic ring include benzylamine, N,N-dimethylbenzylamine, phenylamine, diphenylamine, triphenylamine, aniline, N,N-dimethylaniline, N,N-dimethyl-p-toluidine, 4-aminopyridine, and 4-dimethylaminopyridine.

Examples of the secondary amine include dimethylamine, diethylamine, dipropylamine, dibutylamine, diphenylamine, dicyclopentylamine, and methylbutylamine.

Examples of the tertiary amine include trimethylamine, triethylamine, tripropylamine, and triphenylamine.

Examples of the polyamine include ethylenediamine, 1,3-diaminopropane, diethylenetriamine, triethylenetetramine, tetramethylenepentamine, hexamethylenediamine, tetraethylenepentamine, and a combination of these.

The amine is preferably an alkylamine, more preferably an alkylamine having 3 to 10 carbon atoms, and still more preferably a primary alkylamine having 4 to 10 carbon atoms.

The metal complex may be configured of one amine or two or more amines.

In reacting the metal salt with an amine, a ratio of the molar amount of the amine to a molar amount of the metal salt is preferably 1/1 to 15/1, and more preferably 1.5/1 to 6/1. In a case in which the above ratio is within the above range, the complex formation reaction is completed, and a transparent solution is obtained.

Examples of the ammonium carbamate-based compound as a complexing agent include ammonium carbamate, methylammonium methylcarbamate, ethylammonium ethylcarbamate, 1-propylammonium 1-propylcarbamate, isopropylammonium isopropylcarbamate, butylammonium butylcarbamate, isobutylammonium isobutylcarbamate, amylammonium amylcarbamate, hexylammonium hexylcarbamate, heptylammonium heptylcarbamate, octylammonium octylcarbamate, 2-ethylhexylammonium 2-ethylhexylcarbamate, nonylammonium nonylcarbamate, and decylammonium decylcarbamate.

Examples of the ammonium carbonate-based compound as a complexing agent include ammonium carbonate, methylammonium carbonate, ethylammonium carbonate, 1-propylammonium carbonate, isopropylammonium carbonate, butylammonium carbonate, isobutylammonium carbonate, amylammonium carbonate, hexylammonium carbonate, heptylammonium carbonate, octylammonium carbonate, 2-ethylhexylammonium carbonate, nonylammonium carbonate, and decylammonium carbonate.

Examples of the ammonium bicarbonate-based compound as a complexing agent include ammonium bicarbonate, methylammonium bicarbonate, ethylammonium bicarbonate, 1-propylammonium bicarbonate, isopropylammonium bicarbonate, butylammonium bicarbonate, isobutylammonium bicarbonate, amylammonium bicarbonate, hexylammonium bicarbonate, heptylammonium bicarbonate, octylammonium bicarbonate, 2-ethylhexylammonium bicarbonate, nonylammonium bicarbonate, and decylammonium bicarbonate.

In reacting the metal salt with an ammonium carbamate-based compound, an ammonium carbonate-based compound, or an ammonium bicarbonate-based compound, a ratio of a molar amount of the ammonium carbamate-based compound, the ammonium carbonate-based compound, or the ammonium bicarbonate-based compound to the molar amount of the metal salt is preferably 0.01/1 to 1/1, and more preferably 0.05/1 to 0.6/1.

Examples of the carboxylic acid as a complexing agent include caproic acid, caprylic acid, pelargonic acid, 2-ethylhexanoic acid, capric acid, neodecanoic acid, undecanoic acid, lauric acid, myristic acid, palmitic acid, stearic acid, palmitoleic acid, oleic acid, linoleic acid, and linolenic acid. Among these, the carboxylic acid is preferably a carboxylic acid having 8 to 20 carbon atoms, and more preferably a carboxylic acid having 10 to 16 carbon atoms.

The content of the metal complex in the metal complex ink is preferably 10% by mass to 90% by mass, and more preferably 10% by mass to 40% by mass, with respect to the total amount of the metal complex ink. In a case in which the content of the metal complex is 10% by mass or more, the surface resistivity is further reduced. In a case in which the content of the metal complex is 90% by mass or less, jettability is improved in a case in which the metal particle ink is applied by using an ink jet recording method.

-Solvent-

The metal complex ink preferably contains a solvent. The solvent is not particularly limited as long as it can dissolve the component contained in the metal complex ink, such as the metal complex. From the viewpoint of ease of manufacturing, a boiling point of the solvent is preferably 30° C. to 300° C., more preferably 50° C. to 200° C., and still more preferably 50° C. to 180° C.

The content of the solvent in the metal complex ink is preferably set such that the concentration of metal ions with respect to the metal complex (the amount of the metal present as free ions with respect to 1 g of the metal complex) is 0.01 mmol/g to 3.6 mmol/g, and more preferably set such that the concentration of metal ions is 0.05 mmol/g to 2 mmol/g. In a case in which the concentration of metal ions is within the above range, the metal complex ink has excellent fluidity and can obtain the electromagnetic wave-shielding properties.

Examples of the solvent include a hydrocarbon, a cyclic hydrocarbon, an aromatic hydrocarbon, a carbamate, an alkene, an amide, an ether, an ester, an alcohol, a thiol, a thioether, phosphine, and water. The metal complex ink may contain only one solvent or two or more solvents.

The hydrocarbon is preferably a linear or branched hydrocarbon having 6 to 20 carbon atoms. Examples of the hydrocarbon include pentane, hexane, heptane, octane, nonane, decane, undecane, dodecane, tridecane, tetradecane, pentadecane, hexadecane, octadecane, nonadecane, and icosane.

The cyclic hydrocarbon is preferably a cyclic hydrocarbon having 6 to 20 carbon atoms. The cyclic hydrocarbons can include, for example, cyclohexane, cycloheptane, cyclooctane, cyclononane, cyclodecane, and decalin.

Examples of the aromatic hydrocarbon include benzene, toluene, xylene, and tetraline.

The ether may be any of a linear ether, a branched ether, or a cyclic ether. Examples of the ether include diethyl ether, dipropyl ether, dibutyl ether, methyl-t-butyl ether, tetrahydrofuran, tetrahydropyrane, dihydropyrane, and 1,4-dioxane.

The alcohol may be any of a primary alcohol, a secondary alcohol, or a tertiary alcohol.

Examples of the alcohol include ethanol, 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, decanol, isodecyl alcohol, lauryl alcohol, isolauryl alcohol, myristyl alcohol, isomyristyl alcohol, cetyl alcohol (cetanol), isocetyl alcohol, stearyl alcohol, isostearyl alcohol, oleyl alcohol, isooleyl alcohol, linoleyl alcohol, isolinoleyl alcohol, palmityl alcohol, isopalmityl alcohol, eicosyl alcohol, and isoeicosyl alcohol.

Examples of the ketone include acetone, methyl ethyl ketone, methyl isobutyl ketone, and cyclohexanone.

Examples of the ester include methyl acetate, ethyl acetate, isopropyl acetate, butyl acetate, isobutyl acetate, sec-butyl acetate, methoxybutyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, propylene glycol monoethyl ether acetate, propylene glycol monobutyl ether acetate, dipropylene glycol monomethyl ether acetate, dipropylene glycol monoethyl ether acetate, dipropylene glycol monobutyl ether acetate, and 3-methoxybutyl acetate.

-Reducing Agent-

The metal complex ink may contain a reducing agent. In a case in which the metal complex ink contains a reducing agent, reduction of the metal complex into a metal is facilitated.

Examples of the reducing agent include a borohydride metal salt, an aluminum hydride salt, an amine, an alcohol, an organic acid, reduced sugar, a sugar alcohol, sodium sulfite, a hydrazine compound, dextrin, hydroquinone, hydroxylamine, ethylene glycol, glutathione, and an oxime compound.

The reducing agent may be the oxime compound disclosed in JP2014-516463A. Examples of the oxime compound include acetone oxime, cyclohexanone oxime, 2-butanone oxime, 2,3-butanedione monoxime, dimethyl glyoxime, methyl acetoacetate monoxime, methyl pyruvate monoxime, benzaldehyde oxime, 1-indanone oxime, 2-adamantanone oxime, 2-methylbenzamide oxime, 3-methylbenzamide oxime, 4-methylbenzamide oxime, 3-aminobenzamide oxime, 4-aminobenzamide oxime, acetophenone oxime, benzamide oxime, and pinacolone oxime.

The metal complex ink may contain one reducing agent or two or more reducing agents.

The content of the reducing agent in the metal complex ink is not particularly limited, but is preferably 0.1% by mass to 20% by mass, more preferably 0.3% by mass to 10% by mass, and still more preferably 1% by mass to 5% by mass, with respect to the total amount of the metal complex ink.

-Resin-

The metal complex ink may contain a resin. In a case in which the metal complex ink contains a resin, adhesiveness of the metal complex ink to the substrate is improved.

Examples of the resin include polyester, polyethylene, polypropylene, polyacetal, polyolefin, polycarbonate, polyamide, a fluororesin, a silicone resin, ethyl cellulose, hydroxyethyl cellulose, rosin, an acrylic resin, polyvinyl chloride, polysulfone, polyvinylpyrrolidone, polyvinyl alcohol, a polyvinyl-based resin, polyacrylonitrile, polysulfide, polyamideimide, polyether, polyarylate, polyether ether ketone, polyurethane, an epoxy resin, a vinyl ester resin, a phenol resin, a melamine resin, and a urea resin.

The metal complex ink may contain one resin or two or more resins.

-Additive-

As long as the effects of the present disclosure are not reduced, the metal complex ink may further contain additives such as an inorganic salt, an organic salt, an inorganic oxide such as silica, a surface conditioner, a wetting agent, a crosslinking agent, an antioxidant, a rust inhibitor, a heat-resistant stabilizer, a surfactant, a plasticizer, a curing agent, a thickener, and a silane coupling agent. The total content of the additives in the metal complex ink is preferably 20% by mass or less with respect to the total amount of the metal complex ink.

The viscosity of the metal complex ink is not particularly limited. The viscosity of the metal complex ink need only be 0.01 Pa's to 5000 Pa's, and is preferably 0.1 Pa's to 100 Pa·s. In a case in which the metal complex ink is applied by using a spray method or an ink jet recording method, the viscosity of the metal complex ink is preferably 1 mPa·s to 100 mPa·s, more preferably 2 mPa·s to 50 mPa·s, and still more preferably 3 mPa·s to 30 mPa·s.

The viscosity of the metal complex ink is a value measured at 25° C. by using a viscometer. The viscosity is measured using, for example, a VISCOMETER TV-22 type viscometer (manufactured by Toki Sangyo Co., Ltd.).

The surface tension of the metal complex ink is not particularly limited, and is preferably 20 mN/m to 45 mN/m and more preferably 25 mN/m to 35 mN/m. The surface tension is a value measured at 25° C. by using a surface tension meter.

The surface tension of the metal complex ink is measured using, for example, DY-700 (manufactured by Kyowa Interface Science Co., Ltd.).

(Metal Salt Ink)

The metal salt ink is, for example, an ink composition obtained by dissolving a metal salt in a solvent.

-Metal Salt-

Examples of metals constituting the metal salt include silver, copper, gold, aluminum, magnesium, tungsten, molybdenum, zinc, nickel, iron, platinum, tin, and lead. Among these, from the viewpoint of the electromagnetic wave-shielding properties, the metal constituting the metal salt preferably includes at least one selected from the group consisting of silver, gold, platinum, nickel, palladium, and copper, and more preferably includes silver.

The content of the metal contained in the metal salt ink is preferably 1% by mass to 40% by mass, more preferably 5% by mass to 30% by mass, and still more preferably 7% by mass to 20% by mass, with respect to the total amount of the metal salt ink, in terms of the metal element.

The content of the metal salt in the metal salt ink is preferably 10% by mass to 90% by mass, and more preferably 10% by mass to 40% by mass, with respect to the total amount of the metal salt ink. In a case in which the content of the metal salt is 10% by mass or more, the surface resistivity is further reduced. In a case in which the content of the metal salt is 90% by mass or less, jettability is improved in a case in which the metal particle ink is applied by using a spray method or an ink jet recording method.

Examples of the metal salt include benzoate, halide, carbonate, citrate, iodate, nitrite, nitrate, acetate, phosphate, sulfate, sulfide, trifluoroacetate, and carboxylate of a metal. Two or more salts may be combined.

From the viewpoint of the electromagnetic wave-shielding properties and storage stability, the metal salt is preferably a metal carboxylate. The carboxylic acid forming the carboxylate is preferably at least one selected from the group consisting of formic acid and a carboxylic acid having 1 to 30 carbon atoms, and more preferably a carboxylic acid having 8 to 20 carbon atoms, and still more preferably a fatty acid having 8 to 20 carbon atoms. The fatty acid may be linear or branched or may have a substituent.

Examples of the linear fatty acid include acetic acid, propionic acid, butyric acid, valeric acid, pentanoic acid, hexanoic acid, heptanoic acid, behenic acid, oleic acid, octanoic acid, nonanoic acid, decanoic acid, caproic acid, enanthic acid, caprylic acid, pelargonic acid, capric acid, and undecanoic acid.

Examples of the branched fatty acid include isobutyric acid, isovaleric acid, ethylhexanoic acid, neodecanoic acid, pivalic acid, 2-methylpentanoic acid, 3-methylpentanoic acid, 4-methylpentanoic acid, 2,2-dimethylbutanoic acid, 2,3-dimethylbutanoic acid, 3,3-dimethylbutanoic acid, and 2-ethylbutanoic acid.

Examples of the carboxylic acid having a substituent include hexafluoroacetylacetonate, hydroangelate, 3-hydroxybutyric acid, 2-methyl-3-hydroxybutyric acid, 3-methoxybutyric acid, acetonedicarboxylic acid, 3-hydroxyglutaric acid, 2-methyl-3-hydroxyglutaric acid, and 2,2,4,4-hydroxyglutaric acid.

The metal salt may be a commercially available product or may be manufactured by a known method. A silver salt is manufactured, for example, by the following method.

First, a silver compound (for example, silver acetate) functioning as a silver supply source and formic acid or a fatty acid having 1 to 30 carbon atoms in the same quantity as the molar equivalent of the silver compound are added to an organic solvent such as ethanol. The mixture is stirred for a predetermined time by using an ultrasonic stirrer, and the formed precipitate is washed with ethanol and decanted. All of these steps can be performed at a room temperature (25° C.). A mixing ratio of the silver compound and the formic acid or fatty acid having 1 to 30 carbon atoms is preferably 1:2 to 2:1, and more preferably 1:1, in terms of molar ratio.

-Solvent-

The metal salt ink preferably contains a solvent.

A type of the solvent is not particularly limited as long as it can dissolve the metal salt contained in the metal salt ink.

From the viewpoint of ease of manufacturing, the boiling point of the solvent is preferably 30° C. to 300° C., more preferably 50° C. to 300° C., and still more preferably 50° C. to 250° C.

The content of the solvent in the metal salt ink is preferably set such that the concentration of metal ions with respect to the metal salt (the amount of the metal present as free ions with respect to 1 g of the metal salt) is 0.01 mmol/g to 3.6 mmol/g, and more preferably set such that the concentration of metal ions is 0.05 mmol/g to 2.6 mmol/g. In a case in which the concentration of metal ions is within the above range, the metal salt ink has excellent fluidity and can obtain the electromagnetic wave-shielding properties.

Examples of the solvent include a hydrocarbon, a cyclic hydrocarbon, an aromatic hydrocarbon, a carbamate, an alkene, an amide, an ether, an ester, an alcohol, a thiol, a thioether, phosphine, and water.

The metal salt ink may contain only one solvent or two or more solvents.

The solvent preferably contains an aromatic hydrocarbon.

Examples of the aromatic hydrocarbon include benzene, toluene, xylene, ethylbenzene, propylbenzene, isopropylbenzene, butylbenzene, isobutylbenzene, t-butylbenzene, trimethylbenzene, pentylbenzene, hexylbenzene, tetraline, benzyl alcohol, phenol, cresol, methyl benzoate, ethyl benzoate, propyl benzoate, and butyl benzoate.

From the viewpoint of compatibility with other components, the number of aromatic rings in the aromatic hydrocarbon is preferably 1 or 2, and more preferably 1.

From the viewpoint of ease of manufacturing, a boiling point of the aromatic hydrocarbon is preferably 50° C. to 300° C., more preferably 60° C. to 250° C., and still more preferably 80° C. to 200° C.

The solvent may contain an aromatic hydrocarbon and a hydrocarbon other than the aromatic hydrocarbon.

Examples of the hydrocarbon other than the aromatic hydrocarbon include a linear hydrocarbon having 6 to 20 carbon atoms, a branched hydrocarbon having 6 to 20 carbon atoms, and an alicyclic hydrocarbon having 6 to 20 carbon atoms.

Examples of the hydrocarbon other than the aromatic hydrocarbon include pentane, hexane, heptane, octane, nonane, decane, undecane, dodecane, tridecane, tetradecane, pentadecane, hexadecane, octadecane, nonadecane, decalin, cyclohexane, cycloheptane, cyclooctane, cyclononane, cyclodecane, decene, a terpene-based compound, and icosane.

The hydrocarbon other than the aromatic hydrocarbon preferably contains an unsaturated bond.

Examples of the hydrocarbon containing an unsaturated bond other than the aromatic hydrocarbon include a terpene-based compound.

Depending on the number of isoprene units constituting the terpene-based compound, the terpene-based compound is classified into, for example, a hemiterpene, a monoterpene, a sesquiterpene, a diterpene, a sesterterpene, a triterpene, a sesquarterpene, and a tetraterpene.

The terpene-based compound as the solvent may be any of the above compounds, but is preferably a monoterpene.

Examples of the monoterpene include pinene (α-pinene and β-pinene), terpineol (α-terpineol, β-terpineol, and γ-terpineol), myrcene, camphene, limonene (d-limonene, l-limonene, and dipentene), ocimene (α-ocimene and β-ocimene), alloocimene, phellandrene (α-phellandrene and β-phellandrene), terpinene (α-terpinene and γ-terpinene), terpinolene (α-terpinolene, β-terpinolene, γ-terpinolene, and δ-terpinolene), 1,8-cineole, 1,4-cineole, sabinene, paramenthadiene, and carene (δ-3-carene).

As the monoterpene, a cyclic monoterpene is preferable, and pinene, terpineol, or carene is more preferable.

The ether may be any of a linear ether, a branched ether, or a cyclic ether. Examples of the ether include diethyl ether, dipropyl ether, dibutyl ether, methyl-t-butyl ether, tetrahydrofuran, tetrahydropyrane, dihydropyrane, and 1,4-dioxane.

The alcohol may be any of a primary alcohol, a secondary alcohol, or a tertiary alcohol.

Examples of the alcohol include ethanol, 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, decanol, isodecyl alcohol, lauryl alcohol, isolauryl alcohol, myristyl alcohol, isomyristyl alcohol, cetyl alcohol (cetanol), isocetyl alcohol, stearyl alcohol, isostearyl alcohol, oleyl alcohol, isooleyl alcohol, linoleyl alcohol, isolinoleyl alcohol, palmityl alcohol, isopalmityl alcohol, eicosyl alcohol, and isoeicosyl alcohol.

Examples of the ketone include acetone, methyl ethyl ketone, methyl isobutyl ketone, and cyclohexanone.

Examples of the ester include methyl acetate, ethyl acetate, isopropyl acetate, butyl acetate, isobutyl acetate, sec-butyl acetate, methoxybutyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, propylene glycol monoethyl ether acetate, propylene glycol monobutyl ether acetate, dipropylene glycol monomethyl ether acetate, dipropylene glycol monoethyl ether acetate, dipropylene glycol monobutyl ether acetate, and 3-methoxybutyl acetate.

The viscosity of the metal salt ink is not particularly limited. The viscosity of the metal salt ink need only be 0.01 Pa's to 5000 Pa's, and is preferably 0.1 Pa's to 100 Pa·s. In a case in which the metal salt ink is applied by using a spray method or an ink jet recording method, the viscosity of the metal salt ink is preferably 1 mPa·s to 100 mPa·s, more preferably 2 mPa·s to 50 mPa·s, and still more preferably 3 mPa·s to 30 mPa·s.

The viscosity of the metal salt ink is a value measured at 25° C. by using a viscometer. The viscosity is measured using, for example, a VISCOMETER TV-22 type viscometer (manufactured by Toki Sangyo Co., Ltd.).

The surface tension of the metal salt ink is not particularly limited, and is preferably 20 mN/m to 45 mN/m and more preferably 25 mN/m to 35 mN/m. The surface tension is a value measured at 25° C. by using a surface tension meter.

The surface tension of the metal salt ink is measured using, for example, DY-700 (manufactured by Kyowa Interface Science Co., Ltd.).

The ink for forming an electromagnetic wave shielding layer preferably contains a metal complex or a metal salt.

The metal complex preferably has a structure derived from at least one selected from the group consisting of an ammonium carbamate-based compound, an ammonium carbonate-based compound, an amine, and a carboxylic acid having 8 to 20 carbon atoms.

The metal salt is preferably a metal carboxylate.

<Method for Forming Electromagnetic Wave Shielding Layer>

The second step preferably includes applying the first ink for forming an electromagnetic wave shielding layer to a region that extends over the insulating protective layer and the ground electrode and sintering the first ink for forming an electromagnetic wave shielding layer to form the first layer, and applying the second ink for forming an electromagnetic wave shielding layer onto the ground electrode and sintering the second ink for forming an electromagnetic wave shielding layer to form the second layer.

At least one of the sintering temperature for forming the second layer being higher than the sintering temperature for forming the first layer or the sintering time for forming the second layer being longer than the sintering time for forming the first layer is preferably satisfied. As a result, it is easy to form an electromagnetic wave shielding layer in which the void ratio $S1$ of the portion located on the ground electrode is lower than the void ratio $S2$ of the portion located on the insulating protective layer.

In a case in which the sintering temperature for forming the second layer (hereinafter, also referred to as "sintering temperature of the second layer") being higher than the sintering temperature for forming the first layer (hereinafter, also referred to as "sintering temperature of the first layer") is satisfied, a value obtained by subtracting the sintering temperature of the first layer from the sintering temperature of the second layer is preferably 3° C. or higher, more preferably 5° C. or higher, and still more preferably 10° C. or higher.

The formation of the first layer (that is, the application and sintering of the first ink for forming an electromagnetic wave shielding layer) and the formation of the second layer (that is, the application and sintering of the second ink for forming an electromagnetic wave shielding layer) may be each performed only once, or may be performed twice or more.

The number of times of the formation of the first layer is preferably 2 or more and more preferably 3 or more.

The number of times of the formation of the second layer is preferably 1 or more and more preferably 2 or more.

(Application Method of Ink for Forming Electromagnetic Wave Shielding Layer)

As the application method of the ink for forming an electromagnetic wave shielding layer (specifically, the first ink and the second ink), an ink jet recording method, a dispenser method, or a spray method is preferable, and the ink jet recording method is particularly preferable.

The ink jet recording method may be any of an electric charge control method of jetting an ink by using electrostatic attraction force, a drop-on-demand method (pressure pulse method) using a vibration pressure of a piezo element, an acoustic ink jet method of jetting an ink by using a radiation pressure by means of converting electric signals into acoustic beams and irradiating the ink with the acoustic beams, or a thermal ink jet (Bubble Jet (registered trademark)) method of forming air bubbles by heating an ink and using the generated pressure.

As the ink jet recording method, particularly, an ink jet recording method, disclosed in JP1979-59936A (JP-S54-59936A), of jetting an ink from a nozzle using an action force caused by a rapid change in volume of the ink after being subjected to an action of thermal energy can be effectively used.

Regarding the ink jet recording method, the method disclosed in paragraphs 0093 to 0105 of JP2003-306623A can also be referred to.

Examples of ink jet heads used in the ink jet recording method include ink jet heads for a shuttle method of performing recording while scanning the heads in a width direction of the substrate using short serial heads and a line method using line heads each of which is formed of recording elements arranged for the entire region of one side of the substrate.

In the line method, by scanning the substrate to be scanned in a direction intersecting with the arrangement direction of the recording elements, a pattern can be formed on the entire surface of the substrate. Therefore, this method does not require a transport system such as a carriage that moves short heads for scanning.

In addition, complicated scanning control between the carriage movement and the substrate is not necessary, and only the substrate moves. Therefore, higher recording speeds can be realized compared to the shuttle method.

The amount of droplets of the insulating ink jetted from the ink jet head is preferably 1 pL (picoliter) to 100 pL, more preferably 3 pL to 80 pL, and still more preferably 3 pL to 20 pL.

A temperature of the electronic substrate in a case of applying the ink for forming an electromagnetic wave shielding layer is preferably 20° C. to 120° C., and more preferably 28° C. to 80° C.

(Sintering Temperature)

A baking temperature for sintering the ink for forming an electromagnetic wave shielding layer (for example, the first ink and the second ink) is preferably 250° C. or lower, more preferably 50° C. to 200° C., and still more preferably 60° C. to 120° C.

In addition, a baking time is preferably 1 minute to 120 minutes, and more preferably 1 minute to 40 minutes.

As described above, each of the formation of the first layer and the formation of the second layer may be performed by repeating a cycle of the application and baking of the ink a plurality of times.

In addition, the cycle of the application and baking of the ink may include ultraviolet irradiation between the application and the baking.

From the viewpoint of the electromagnetic wave-shielding properties, the thickness of the electromagnetic wave shielding layer is preferably 0.1 μm to 30 μm, and more preferably 0.3 μm to 15 μm.

The thickness of the electromagnetic wave shielding layer is measured using a laser microscope (trade name "VK-X1000" manufactured by KEYENCE CORPORATION.).

<Ink for Forming Insulating Protective Layer>

In the present disclosure, the insulating protective layer is preferably a solidified product of the ink for forming an insulating protective layer.

That is, the insulating protective layer in the present disclosure is preferably formed by applying the ink for forming an insulating protective layer and solidifying the ink for forming an insulating protective layer.

The ink for forming an insulating protective layer is preferably an active energy ray curable-type ink.

The ink for forming an insulating protective layer, which is the active energy ray curable-type ink, contains a polymerizable monomer and a polymerization initiator.

(Polymerizable Monomer)

The polymerizable monomer refers to a monomer having at least one polymerizable group in one molecule. The polymerizable group in the polymerizable monomer may be a cationically polymerizable group or a radically polymerizable group. From the viewpoint of curing properties, the polymerizable group is preferably a radically polymerizable group. In addition, from the viewpoint of curing properties, the radically polymerizable group is preferably an ethylenically unsaturated group.

In the present disclosure, the monomer refers to a compound having a molecular weight of 1000 or less. The molecular weight can be calculated from the type and number of atoms constituting the compound.

The polymerizable monomer may be a monofunctional polymerizable monomer having one polymerizable group or a polyfunctional polymerizable monomer having two or more polymerizable groups.

The monofunctional polymerizable monomer is not particularly limited as long as it is a monomer having one polymerizable group. From the viewpoint of curing properties, the monofunctional polymerizable monomer is preferably a monofunctional radically polymerizable monomer, and more preferably a monofunctional ethylenically unsaturated monomer.

Examples of the monofunctional ethylenically unsaturated monomer include monofunctional (meth)acrylate, monofunctional (meth)acrylamide, a monofunctional aromatic vinyl compound, monofunctional vinyl ether, and a monofunctional N-vinyl compound.

Examples of the monofunctional (meth)acrylate include methyl (meth)acrylate, ethyl (meth)acrylate, propyl (meth)acrylate, n-butyl (meth)acrylate, hexyl (meth)acrylate, 2-ethylhexyl (meth)acrylate, tert-octyl (meth)acrylate, isoamyl (meth)acrylate, decyl (meth)acrylate, isodecyl (meth)acrylate, lauryl (meth)acrylate, stearyl (meth)acrylate, isostearyl (meth)acrylate, cyclohexyl (meth)acrylate, 4-n-butylcyclohexyl (meth)acrylate, 4-tert-butylcyclohexyl (meth)acrylate, bornyl (meth)acrylate, isobornyl (meth)acrylate, 2-ethylhexyldiglycol (meth)acrylate, butoxyethyl (meth)acrylate, 2-chloroethyl (meth)acrylate, 4-bromobutyl (meth)acrylate, cyanoethyl (meth)acrylate, benzyl (meth)acrylate, butoxymethyl (meth)acrylate, 3-methoxybutyl (meth)acrylate, 2-(2-methoxyethoxy)ethyl (meth)acrylate, 2-(2-butoxyethoxy)ethyl (meth)acrylate, 2,2,2-tetrafluoroethyl (meth)acrylate, 1H,1H,2H,2H-perfluorodecyl (meth)acrylate, 4-butylphenyl (meth)acrylate, phenyl (meth)acrylate, 2,4,5-tetramethylphenyl (meth)acrylate, 4-chlorophenyl (meth)acrylate, 2-phenoxymethyl (meth)acrylate, 2-phenoxyethyl (meth)acrylate, glycidyl (meth)acrylate, glycidyloxybutyl (meth)acrylate, glycidyloxyethyl (meth)acrylate, glycidyloxypropyl (meth)acrylate, tetrahydrofurfuryl (meth)acrylate, 2-hydroxyethyl (meth)acrylate, 3-hydroxypropyl (meth)acrylate, 2-hydroxypropyl (meth)acrylate, 2-hydroxybutyl (meth)acrylate, 3-hydroxybutyl (meth)acrylate, 4-hydroxybutyl (meth)acrylate, cyclic trimethylolpropane formal (meth)acrylate, phenylglycidyl ether (meth)acrylate, dimethylaminoethyl (meth)acrylate, diethylaminoethyl (meth)acrylate, dimethylaminopropyl (meth)acrylate, diethylaminopropyl (meth)acrylate, trimethoxysilylpropyl (meth)acrylate, trimethylsilylpropyl (meth)acrylate, polyethylene oxide monomethyl ether (meth)acrylate, polyethylene oxide (meth)acrylate, polyethylene oxide monoalkyl ether (meth)acrylate, dipropylene glycol (meth)acrylate, polypropylene oxide monoalkyl ether (meth)acrylate, 2-methacryloyloxyethyl succinate, 2-methacryloyloxyhexahydrophthalic acid, 2-methacryloyloxyethyl-2-hydroxypropyl phthalate, ethoxydiethylene glycol (meth)acrylate, butoxydiethylene glycol (meth)acrylate, trifluoroethyl (meth)acrylate, perfluorooctylethyl (meth)acrylate, 2-hydroxy-3-phenoxypropyl (meth)acrylate, ethylene oxide (EO)-modified phenol (meth)acrylate, EO-modified cresol (meth)acrylate, EO-modified nonylphenol (meth)acrylate, propylene oxide (PO)-modified nonylphenol (meth)acrylate, EO-modified-2-ethylhexyl (meth)acrylate, dicyclopentenyl (meth)acrylate, dicyclopentenyloxyethyl (meth)acrylate, dicyclopentanyl (meth)acrylate, (3-ethyl-3-oxetanylmethyl) (meth)acrylate, phenoxyethylene glycol (meth)acrylate, 2-carboxyethyl (meth)acrylate, and 2-(meth) acryloyloxyethyl succinate.

Among these, from the viewpoint of improving heat resistance, the monofunctional (meth)acrylate is preferably a monofunctional (meth)acrylate having an aromatic ring or an aliphatic ring, and is more preferably isobornyl (meth)acrylate, 4-tert-butylcyclohexyl (meth)acrylate, dicyclopentenyl (meth)acrylate, or dicyclopentanyl (meth)acrylate.

Examples of the monofunctional (meth)acrylamide include (meth)acrylamide, N-methyl (meth)acrylamide, N-ethyl (meth)acrylamide, N-propyl (meth)acrylamide, N-n-butyl (meth)acrylamide, N-t-butyl (meth)acrylamide, N-butoxymethyl (meth)acrylamide, N-isopropyl (meth)acrylamide, N-methylol (meth)acrylamide, N,N-dimethyl (meth)acrylamide, N,N-diethyl (meth)acrylamide, and (meth)acryloylmorpholine.

Examples of the monofunctional aromatic vinyl compound include styrene, dimethylstyrene, trimethylstyrene, isopropylstyrene, chloromethylstyrene, methoxystyrene, acetoxystyrene, chlorostyrene, dichlorostyrene, bromostyrene, vinyl benzoic acid methyl ester, 3-methylstyrene, 4-methylstyrene, 3-ethylstyrene, 4-ethylstyrene, 3-propylstyrene, 4-propylstyrene, 3-butylstyrene, 4-butylstyrene, 3-hexylstyrene, 4-hexylstyrene, 3-octylstyrene, 4-octylstyrene, 3-(2-ethylhexyl)styrene, 4-(2-ethylhexyl)styrene, allyl styrene, isopropenyl styrene, butenyl styrene, octenyl styrene, 4-t-butoxycarbonyl styrene, and 4-t-butoxystyrene.

Examples of the monofunctional vinyl ether include methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Examples of the monofunctional N-vinyl compound include N-vinyl-ε-caprolactam and N-vinylpyrrolidone.

The polyfunctional polymerizable monomer is not particularly limited as long as it is a monomer having two or more polymerizable groups. From the viewpoint of curing properties, the polyfunctional polymerizable monomer is preferably a polyfunctional radically polymerizable monomer, and more preferably a polyfunctional ethylenically unsaturated monomer.

Examples of the polyfunctional ethylenically unsaturated monomer include a polyfunctional (meth)acrylate compound and a polyfunctional vinyl ether.

Examples of the polyfunctional (meth)acrylate include ethylene glycol di(meth)acrylate, diethylene glycol di(meth)acrylate, triethylene glycol di(meth)acrylate, polyethylene glycol di(meth)acrylate, propylene glycol di(meth)acrylate, dipropylene glycol di(meth)acrylate, tripropylene glycol di(meth)acrylate, polypropylene glycol di(meth)acrylate, butylene glycol di(meth)acrylate, tetraethylene glycol di(meth)acrylate, neopentyl glycol di(meth)acrylate, 3-methyl-1,5-pentanediol di(meth)acrylate, 1,4-butanediol di(meth)acrylate, 1,6-hexanediol di(meth)acrylate, heptanediol di(meth)acrylate, EO-modified neopentyl glycol di(meth)acrylate, PO-modified neopentyl glycol di(meth)acrylate, EO-modified hexanediol di(meth)acrylate, PO-modified hexanediol di(meth)acrylate, octanediol di(meth)acrylate, nonanediol di(meth)acrylate, decanediol di(meth)acrylate, dodecanediol di(meth)acrylate, glycerin di(meth)acrylate, pentaerythritol di(meth)acrylate, ethylene glycol diglycidyl ether di(meth)acrylate, diethylene glycol diglycidyl ether di(meth)acrylate, tricyclodecanedimethanol di(meth)acrylate, trimethylolethane tri(meth)acrylate, trimethylolpropane tri(meth)acrylate, trimethylolpropane EO-added tri(meth)acrylate, pentaerythritol tri(meth)acrylate, pentaerythritol tetra(meth)acrylate, dipentaerythritol tetra(meth)acrylate, dipentaerythritol penta(meth)acrylate, dipentaerythritol hexa(meth)acrylate, tri(meth)acryloyloxyethoxytrimethylolpropane, glycerin polyglycidyl ether poly(meth)acrylate, and tris(2-acryloyloxyethyl) isocyanurate.

Examples of the polyfunctional vinyl ether include 1,4-butanediol divinyl ether, ethylene glycol divinyl ether, diethylene glycol divinyl ether, triethylene glycol divinyl ether, polyethylene glycol divinyl ether, propylene glycol divinyl ether, butylene glycol divinyl ether, hexanediol divinyl ether, 1,4-cyclohexanedimethanol divinyl ether, bisphenol A alkylene oxide divinyl ether, bisphenol F alkylene oxide divinyl ether, trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, EO-added trimethylolpropane trivinyl ether, PO-added trimethylolpropane trivinyl ether, EO-added ditrimethylolpropane tetravinyl ether, PO-added ditrimethylolpropane tetravinyl ether, EO-added pentaerythritol tetravinyl ether, PO-added pentaerythritol tetravinyl ether, EO-added dipentaerythritol hexavinyl ether, and PO-added dipentaerythritol hexavinyl ether.

Among these, from the viewpoint of curing properties, the polyfunctional polymerizable monomer is preferably a monomer having 3 to 11 carbon atoms in a portion other than a (meth)acryloyl group. As the monomer having 3 to 11 carbon atoms in a portion other than a (meth)acryloyl group, specifically, 1,6-hexanediol di(meth)acrylate, dipropylene glycol di(meth)acrylate, PO-modified neopentyl glycol di(meth)acrylate, 1,4-butanediol di(meth)acrylate, 3-methyl-1,5-pentanediol di(meth)acrylate, polyethylene glycol di(meth)acrylate (EO chain n=4), or 1,10-decanediol di(meth)acrylate is more preferable.

The content of the polymerizable monomer is preferably 10% by mass to 98% by mass, and more preferably 50% by mass to 98% by mass, with respect to the total amount of the ink for forming an insulating protective layer.

(Polymerization Initiator)

Examples of the polymerization initiator contained in the ink for forming an insulating protective layer include an oxime compound, an alkylphenone compound, an acylphosphine compound, an aromatic onium salt compound, an organic peroxide, a thio compound, a hexaarylbisimidazole compound, a borate compound, an azinium compound, a titanocene compound, an active ester compound, a carbon halogen bond-containing compound, and an alkylamine.

Among these, from the viewpoint of further improving conductivity, the polymerization initiator contained in the ink for forming an insulating layer is preferably at least one selected from the group consisting of an oxime compound, an alkylphenone compound, and a titanocene compound, more preferably an alkylphenone compound, and still more preferably at least one selected from the group consisting of an α-aminoalkylphenone compound, a benzyl ketal, and an alkylphenone.

The content of the polymerization initiator is preferably 0.5% by mass to 20% by mass, and more preferably 2% by mass to 10% by mass, with respect to the total amount of the ink for forming an insulating layer.

The ink for forming an insulating protective layer may contain other components different from the polymerization initiator and the polymerizable monomer. Examples of the other components include a chain transfer agent, a polymerization inhibitor, a sensitizer, a surfactant, and an additive.

(Chain Transfer Agent)

The ink for forming an insulating protective layer may contain at least one chain transfer agent.

From the viewpoint of improving reactivity of photopolymerization reaction, the chain transfer agent is preferably a polyfunctional thiol.

Examples of the polyfunctional thiol include aliphatic thiols such as hexane-1,6-dithiol, decane-1,10-dithiol, dimercaptodiethyl ether, and dimercaptodiethyl sulfide, aromatic thiols such as xylylene dimercaptan, 4,4'-dimercaptodiphenylsulfide, and 1,4-benzenedithiol; poly(mercaptoacetate) of a polyhydric alcohol such as ethylene glycol bis(mercaptoacetate), polyethylene glycol bis(mercaptoacetate), propylene glycol bis(mercaptoacetate), glycerin tris(mercaptoacetate), trimethylolethane tris(mercaptoacetate), trimethylolpropane tris(mercaptoacetate), pentaerythritol tetrakis(mercaptoacetate), and dipentaerythritol hexakis(mercaptoacetate); poly(3-mercaptopropionate) of a polyhydric alcohol such as ethylene glycol bis(3-mercaptopropionate), polyethylene glycol bis(3-mercaptopropionate), propylene glycol bis(3-mercaptopropionate), glycerin tris(3-mercaptopropionate), trimethylolethane tris(mercaptopropionate), trimethylolpropane tris(3-mercaptopropionate), pentaerythritol tetrakis(3-mercaptopropionate), and dipentaerythritol hexakis(3-mercaptopropionate); and poly(mercaptobutyrate) such as 1,4-bis(3-mercaptobutyryloxy)butane, 1,3,5-tris(3-mercaptobutyloxyethyl)-1,3,5-triazine-2,4,6(1H,3H,5H)-trione, and pentaerythritol tetrakis(3-mercaptobutyrate).

(Polymerization Inhibitor)

The ink for forming an insulating protective layer may contain at least one polymerization inhibitor.

Examples of the polymerization inhibitor include p-methoxyphenol, quinones (for example, hydroquinone, benzoquinone, and methoxybenzoquinone), phenothiazine, catechols, alkylphenols (for example, dibutyl hydroxy toluene (BHT)), alkyl bisphenols, zinc dimethyldithiocarbamate, copper dimethyldithiocarbamate, copper dibutyldithiocarbamate, copper salicylate, thiodipropionic acid esters, mercaptobenzimidazole, phosphites, 2,2,6,6-tetramethylpiperidine-1-oxyl (TEMPO), 2,2,6,6-tetramethyl-4-hydroxypiperidine-1-oxyl (TEMPOL), and tris(N-nitroso-N-phenylhydroxylamine)aluminum salt (also known as Cupferron Al).

Among these, as the polymerization inhibitor, at least one selected from p-methoxyphenol, catechols, quinones, alkylphenols, TEMPO, TEMPOL, and tris(N-nitroso-N-phenylhydroxylamine)aluminum salt is preferable, and at least one selected from p-methoxyphenol, hydroquinone, benzoquinone, BHT, TEMPO, TEMPOL, and tris(N-nitroso-N-phenylhydroxylamine)aluminum salt is more preferable.

In a case in which the ink for forming an insulating protective layer contains a polymerization inhibitor, the content of the polymerization inhibitor is preferably 0.01% by mass to 2.0% by mass, more preferably 0.02% by mass to 1.0% by mass, and particularly preferably 0.03% by mass to 0.5% by mass, with respect to the total amount of the ink for forming an insulating protective layer.

(Sensitizer)

The ink for forming an insulating protective layer may contain at least one sensitizer.

Examples of the sensitizer include a polynuclear aromatic compound (for example, pyrene, perylene, triphenylene, and 2-ethyl-9,10-dimethoxyanthracene), a xanthene-based compound (for example, fluorescein, eosin, erythrosin, rhodamine B, and rose bengal), a cyanine-based compound (for example, thiacarbocyanine and oxacarbocyanine), a merocyanine-based compound (for example, merocyanine and carbomerocyanine), a thiazine-based compound (for example, thionine, methylene blue, and toluidine blue), an acridine-based compound (for example, acridine orange, chloroflavine, and acryflavine), anthraquinones (for example, anthraquinone), a squarylium-based compound (for example, squarylium), a coumarin-based compound (for example, 7-diethylamino-4-methylcoumarin), a thioxanthone-based compound (for example, isopropylthioxanthone), and a thiochromanone-based compound (for example, thiochromanone). Among these, the sensitizer is preferably a thioxanthone-based compound.

In a case in which the ink for forming an insulating protective layer contains a sensitizer, the content of the sensitizer is not particularly limited, but is preferably 1.0% by mass to 15.0% by mass, and more preferably 1.5% by mass to 5.0% by mass, with respect to the total amount of the ink for forming an insulating protective layer.

(Surfactant)

The ink for forming an insulating protective layer may contain at least one surfactant.

Examples of the surfactant include surfactants disclosed in JP1987-173463A (JP-S62-173463A) and JP1987-183457A (JP-S62-183457A). In addition, examples of the surfactant include anionic surfactants such as dialkyl sulfosuccinate, alkyl naphthalene sulfonate, and a fatty acid salt; nonionic surfactants such as polyoxyethylene alkyl ether, polyoxyethylene alkyl allyl ether, acetylene glycol, and a polyoxyethylene-polyoxypropylene block copolymer; and cationic surfactants such as an alkylamine salt and a quaternary ammonium salt. In addition, the surfactant may be a fluorine-based surfactant or a silicone-based surfactant.

In a case in which the ink for forming an insulating protective layer contains a surfactant, the content of the surfactant is preferably 0.5% by mass or less, and more preferably 0.1% by mass or less, with respect to the total amount of the ink for forming an insulating protective layer. A lower limit of the content of the surfactant is not particularly limited.

In a case in which the content of the surfactant is 0.5% by mass or less, the ink for forming an insulating protective layer is difficult to spread after being applied. Therefore, an outflow of the ink for forming an insulating protective layer is suppressed, thus improving the electromagnetic wave-shielding properties.

(Organic Solvent)

The ink for forming an insulating protective layer may contain at least one organic solvent.

Examples of the organic solvent include (poly)alkylene glycol monoalkyl ethers such as ethylene glycol monoethyl ether, diethylene glycol monoethyl ether, triethylene glycol monomethyl ether, propylene glycol monomethyl ether (PGME), dipropylene glycol monomethyl ether, and tripropylene glycol monomethyl ether; (poly)alkylene glycol dialkyl ethers such as ethylene glycol dibutyl ether, diethylene glycol dimethyl ether, diethylene glycol diethyl ether, dipropylene glycol diethyl ether, and tetraethylene glycol dimethyl ether; (poly)alkylene glycol acetates such as diethylene glycol acetate; (poly)alkylene glycol diacetates such as ethylene glycol diacetate and propylene glycol diacetate; (poly)alkylene glycol monoalkyl ether acetates such as ethylene glycol monobutyl ether acetate and propylene glycol monomethyl ether acetate, ketones such as methyl ethyl ketone and cyclohexanone; lactones such as γ-butyrolactone; esters such as ethyl acetate, propyl acetate, butyl acetate, 3-methoxybutyl acetate (MBA), methyl propionate, and ethyl propionate; cyclic ethers such as tetrahydrofuran and dioxane; and amides such as dimethylformamide and dimethylacetamide.

In a case in which the ink for forming an insulating protective layer contains an organic solvent, the content of the organic solvent is preferably 70% by mass or less, and more preferably 50% by mass or less, with respect to the total amount of the ink for forming an insulating protective layer. A lower limit of the content of the organic solvent is not particularly limited.

(Additive)

As necessary, the ink for forming an insulating protective layer may contain an additive such as a co-sensitizer, an ultraviolet absorber, an antioxidant, an antifading agent, and a basic compound.

(Physical Properties)

From the viewpoint of improving jetting stability in a case in which the ink for forming an insulating protective layer is applied by using an ink jet recording method, a pH of the ink for forming an insulating protective layer is preferably 7 to 10, and more preferably 7.5 to 9.5. The pH is measured at 25° C. using a pH meter, such as a pH meter (model number "HM-31") manufactured by DKK-Toa Corporation.

The viscosity of the ink for forming an insulating protective layer is preferably 0.5 mPa·s to 60 mPa·s, and more preferably 2 mPa·s to 40 mPa·s. The viscosity is measured at 25° C. using a viscometer, such as a TV-22 type viscometer manufactured by Toki Sangyo Co., Ltd.

The surface tension of the ink for forming an insulating protective layer is preferably 60 mN/m or less, more preferably 20 mN/m to 50 mN/m, and still more preferably 25 mN/m to 45 mN/m. The surface tension is measured at 25° C. using a surface tension meter, for example, by a plate method using an automatic surface tension meter (trade name, "CBVP-Z") manufactured by Kyowa Interface Science Co., Ltd.

<Method for Forming Insulating Protective Layer>

In the first step, it is preferable that the ink for forming an insulating protective layer is applied onto an electronic substrate by using an ink jet recording method, a dispenser coating method, or a spray coating method and the ink for forming an insulating protective layer is cured, to form an insulating protective layer.

From the viewpoint of making it possible to form a thin ink film by applying once a small amount of droplets by means of jetting, it is preferable that the ink for forming an insulating protective layer is applied by an ink jet recording method. Details of the ink jet recording method are as described above.

A method of curing the ink for forming an insulating protective layer is not particularly limited, and examples thereof include a method of irradiating the ink for forming an insulating protective layer applied onto the substrate with an active energy ray.

Examples of the active energy ray include ultraviolet rays, visible rays, and electron beams. Among these, ultraviolet rays (hereinafter, also referred to as "UV") are preferable.

A peak wavelength of the ultraviolet rays is preferably 200 nm to 405 nm, more preferably 250 nm to 400 nm, and still more preferably 300 nm to 400 nm.

An exposure amount during the irradiation with an active energy ray is preferably 100 mJ/cm$^2$ to 5000 mJ/cm$^2$, and more preferably 300 mJ/cm$^2$ to 1500 mJ/cm$^2$.

As a light source for ultraviolet irradiation, a mercury lamp, a gas laser, and a solid-state laser are mainly used, and a mercury lamp, a metal halide lamp, and an ultraviolet fluorescent lamp are widely known. In addition, a light emitting diode (UV-LED) and a laser diode (UV-LD) are compact, long-life, highly efficient, and low-cost, and are expected to be used as the light source for ultraviolet irradiation. Among these, the light source for ultraviolet irradiation is preferably a metal halide lamp, a high-pressure mercury lamp, a medium-pressure mercury lamp, a low-pressure mercury lamp, or UV-LED.

In the step of obtaining the insulating protective layer, in order to obtain an insulating protective layer having a desired thickness, the step of applying the insulating ink and irradiating the insulating ink with an active energy ray is preferably repeated two or more times.

A thickness of the insulating protective layer is preferably 5 μm to 5000 μm, and more preferably 10 μm to 2000 μm.

EXAMPLES

Hereinafter, examples of the present disclosure will be shown, but the present disclosure is not limited to the following examples.

Example 1

<Manufacture of Electronic Device X1>
(Preparation of Electronic Substrate B1)

The shielding can and the frame were removed from the LTE module manufactured by Quectel, Inc. to obtain an electronic substrate B1.

The electronic substrate B1 is included in a range of the electronic substrate (that is, an electronic substrate comprising a wiring board having a mounting surface, a ground electrode that defines a ground region on the mounting surface, and an electronic component that is located on the mounting surface and is disposed in the ground region) according to the present disclosure.

(Preparation of Ink for Forming Insulating Protective Layer)

The components of the following composition were mixed together, and the mixture was stirred for 20 minutes at 25° C. under a condition of 5000 rpm by using a mixer (trade name "L4R" manufactured by Silverson), thereby obtaining an ink for forming an insulating protective layer.

-Composition of Ink for Forming Insulating Protective Layer-

Omni. 379: 2-(dimethylamino)-2-(4-methylbenzyl)-1-(4-morpholinophenyl)-butan-1-one (trade name "Omnirad 379" manufactured by IGM Resins B.V., Inc.) . . . 1.0% by mass 4-PBZ: 4-phenylbenzophenone (trade name "Omnirad 4-PBZ" manufactured by IGM Resins B. V.) . . . 7.5% by mass NVC: N-vinylcaprolactam (manufactured by FUJIFILM Wako Pure Chemical Corporation) . . . 15.0% by mass HDDA: 1,6-hexanediol diacrylate (trade name "SR238" manufactured by Sartomer Japan Inc.) . . . 25.5% by mass IBOA: isobornyl acrylate (trade name "SR506" manufactured by Sartomer Japan Inc.) . . . 30.0% by mass Pentaerythritol tetrakis(3-mercaptobutyrate) trade name "KARENZ MT-PE1" 20.0% by mass MEHQ: p-methoxyphenol (manufactured by FUJIFILM Wako Pure Chemical Corporation) . . . 1.0% by mass (Preparation of Ink for Forming Electromagnetic Wave Shielding Layer (Ink A))

40 g of silver neodecanoate was added to a 200 mL three-neck flask. Next, 30.0 g of trimethylbenzene and 30.0 g of terpineol were added thereto and stirred, thereby obtaining a solution containing a silver salt. The obtained solution was filtered using a membrane filter made of polytetrafluoroethylene (PTFE) having a pore diameter of 0.45 μm, thereby obtaining an ink A as an ink for forming an electromagnetic wave shielding layer.

(Preparation of Ink for Forming Electromagnetic Wave Shielding Layer (Ink B))

-Preparation of Silver Particle Dispersion 1-

As a dispersing agent, 6.8 g of polyvinylpyrrolidone (weight-average molecular weight 3000, manufactured by Sigma-Aldrich Corporation) was dissolved in 100 mL of water, thereby preparing a solution a. In addition, 50.00 g of silver nitrate was dissolved in 200 mL of water, thereby preparing a solution b. The solution a and the solution b were mixed together and stirred, thereby obtaining a mixed solution. At a room temperature, 78.71 g of an 85% by mass N,N-diethylhydroxylamine aqueous solution was added dropwise to the mixed solution. In addition, a solution obtained by dissolving 6.8 g of polyvinylpyrrolidone in 1000 ml of water was slowly added dropwise to the mixed solution at a room temperature. The obtained suspension was passed through an ultrafiltration unit (VIVAFLOW 50 manufactured by Sartorius Stedim Biotech GmbH., molecular weight cut-off: 100000, number of units: 4) and purified by being passed through purified water until about 5 L of exudate is discharged from an ultrafiltration unit. The supply of purified water was stopped, followed by concentration, thereby obtaining 30 g of a silver particle dispersion 1. The solid content in this dispersion was 50% by mass, and the content of silver in the solid content that was measured by TG-DTA (simultaneous measurement of thermogravimetry and differential thermal analysis) (manufactured by Hitachi High-Tech Corporation., model: STA 7000 series) was 96.0% by mass. The obtained silver particle dispersion 1 was diluted 20-fold with deionized water, and measured using a particle size analyzer FPAR-1000 (manufactured by Otsuka Electronics Co., Ltd) to obtain a volume average particle size of the silver particles. A volume average particle size of the silver particle dispersion 1 was 60 nm.

-Preparation of Ink B-

2 g of 2-propanol and 0.1 g of OLFINE E-1010 (manufactured by Nissin Chemical Industry Co., Ltd.) as a surfactant were added to 10 g of the silver particle dispersion, and water was added thereto such that the silver concentration reaches 40% by mass, thereby obtaining an ink B as an ink for forming an electromagnetic wave shielding layer.

(Formation of Insulating Protective Layer (First Step))

An ink jet recording device (trade name "DMP-2850" manufactured by Fujifilm Dimatix Inc.) was prepared, and an ink cartridge (10 picoliters) of this ink jet recording device was filled with the ink B1 for forming an insulating protective layer.

UV SPOT CURE OmniCure S2000 (manufactured by Lumen Dynamics Group Inc.) was disposed next to the ink jet head of the ink jet recording device.

The ink for forming an insulating protective layer was jetted from the ink jet head in the ink jet recording device and applied to a formation region of the insulating protective layer on the electronic substrate, and the applied ink Al for forming an insulating protective layer was irradiated with ultraviolet rays (UV) by UV spot curing. By repeating a set of the application of the ink and UV irradiation, an insulating protective layer was formed.

A pattern of the insulating protective layer was set such that it covers the electronic component in the ground region of the electronic substrate B1 and a pattern edge is located inside an inner edge of the ground electrode (for example, see FIG. 2A).

Application conditions of the ink for forming an insulating protective layer were set to conditions in which a resolution is 1270 dots per inch (dpi) and the amount of droplets is 10 picoliters per dot.

(Formation of Electromagnetic Wave Shielding Layer (Second Step))

An ink jet recording device (trade name "DMP-2850" manufactured by Fujifilm Dimatix Inc.) was prepared, and an ink cartridge (10 picoliters) of this ink jet recording device was filled with the ink A as the first ink (that is, the first ink for forming an electromagnetic wave shielding layer) and the ink A as the second ink (that is, the second ink for forming an electromagnetic wave shielding layer).

Next, the electronic substrate on which the insulating protective layer was formed was heated to 60° C.

Next, the ink A as the first ink was jetted from the ink jet head in the ink jet recording device and applied to the region that extends over the insulating protective layer and the ground electrode in the electronic substrate, and was sintered at the sintering temperature and the sintering time shown in Table 1.

A set of the application and sintering of the first ink described above was repeated the number of times shown in Table 1 to obtain a first layer (for example, see FIG. 3A).

Next, the ink A as the second ink was jetted from the ink jet head in the ink jet recording device and applied onto the ground electrode of the electronic substrate, and was sintered at the sintering temperature and the sintering time shown in Table 1. In order to reliably apply the second ink onto the ground electrode in the application, a width of the pattern of the second ink was made greater than a width of the ground electrode. Specifically, in plan view, the pattern of the second ink was set to protrude from both end portions of the ground electrode (width of 0.7 mm) in the width direction by 0.15 mm.

A set of the application and sintering of the second ink described above was repeated the number of times shown in Table 1 to obtain a second layer (for example, see FIG. 4A).

By forming the first layer and the second layer as described above, the electromagnetic wave shielding layer that extends over the insulating protective layer and the ground electrode, covers the insulating protective layer, and is electrically connected to the ground electrode was obtained.

In this manner, the insulating protective layer and the electromagnetic wave shielding layer were formed on the electronic substrate B1 to obtain an electronic device X1.

<Measurement and Evaluation>

The following measurements and evaluation were executed on the electronic device X1.

The results are shown in Table 1.

(Measurement of Void Ratio S1 and Void Ratio S2)

The void ratio S1 of the portion of the electromagnetic wave shielding layer located on the ground electrode and the void ratio S2 of the portion of the electromagnetic wave shielding layer located on the insulating protective layer in the electronic device X1 were measured by the above-described method.

Based on the obtained results, the S2/S1 ratio ("S2/S1" in Table 1) was obtained.

The results thereof are shown in Table 1.

(Evaluation of Electromagnetic Wave-Shielding Properties of Electromagnetic Wave Shielding Layer (Low Frequency and High Frequency))

The communication of the electronic device X1 obtained above was made with LTE BAND 13, near magnetic field measurement was executed using a near magnetic field measuring device (trade name "SmartScan 550" manufactured by API Corporation), and a noise suppression level (unit: dB) was measured.

The noise suppression level was measured for each of a low frequency (1 GHz or less) and a high frequency (1 GHz to 5 GHZ).

Based on the obtained noise suppression level, the electromagnetic wave-shielding properties of the electromagnetic wave shielding layer were evaluated according to the following evaluation standard.

The results are shown in Table 1.

In the following evaluation standard, a case of the best electromagnetic wave-shielding properties of the electromagnetic wave shielding layer is ranked "4".

-Evaluation Standard for Electromagnetic Wave-Shielding Properties of Electromagnetic Wave Shielding Layer-
  4: The noise suppression level was less than −30 dB.
  3: The noise suppression level was −30 dB or more and less than −20 dB.
  2: The noise suppression level was −20 dB or more and less than −10 dB.
  1: The noise suppression level was −10 dB or more.

(Evaluation of Durability of Electromagnetic Wave Shielding Layer (Low Frequency and High Frequency))

The electronic device X1 obtained above was subjected to a cycle test of 1000 cycles at a temperature from −15° ° C. to 90° C.

The electronic device X1 after the cycle test was evaluated in the same manner as in the evaluation of the electromagnetic wave-shielding properties (low frequency and high frequency) of the electromagnetic wave shielding layer.

The results are shown in Table 1.

The evaluation standard for the durability of the electromagnetic wave shielding layer is the same as the evaluation standard for the electromagnetic wave-shielding properties of the electromagnetic wave shielding layer described above.

In the evaluation standard for the durability of the electromagnetic wave shielding layer, a case of the best durability of the electromagnetic wave shielding layer is ranked "4".

Examples 2 to 12

The same operation as in Example 1 was executed except that the combination of the forming conditions of the first layer (including the type of the first ink) and the forming conditions of the second layer (including the type of the second ink) was changed as shown in Table 1.

The results are shown in Table 1.

Comparative Example 1

The same operation as in Example 1 was executed except that the second layer was not formed, and the forming conditions of the first layer were changed as shown in Table 1.

The results are shown in Table 1.

ments, patent applications, and technical standards described in the present specification are herein incorporated by reference to the same extent that each individual document, patent application, or technical standard was specifically and individually indicated to be incorporated by reference.

TABLE 1

| | Electromagnetic wave shielding layer | | | | | | | | | |
|---|---|---|---|---|---|---|---|---|---|---|
| | Formation of first layer (in ground region + on ground electrode) | | Formation of second layer (on ground electrode) | | | | | | | |
| | | Sintering temperature (° C.), sintering time (minutes), and the number of times of repetition | | Sintering temperature (° C.), sintering time (minutes), and the number of times of repetition | | | | Evaluation result | | |
| | | | | | | | | | | Durability |
| | | | | | Void ratio S2 | Void ratio S1 | | Electromagnetic wave-shielding property | | Low frequency after cycle test | High frequency after cycle test |
| | First ink | of application and sintering (times) | Second ink | of application and sintering (times) | (in ground region) | (on ground electrode) | S2/S1 | Low frequency | High frequency | | |
| Comparative Example 1 | Ink A | 160° C., 10 minutes, 10 times | | Second layer is not formed. | 12.5% | 12.5% | 1.00 | 4 | 4 | 2 | 2 |
| Example 1 | Ink A | 165° C., 10 minutes, 7 times | Ink A | 170° C., 20 minutes, 3 times | 11.5% | 10.5% | 1.10 | 4 | 4 | 3 | 4 |
| Example 2 | Ink A | 160° C., 10 minutes, 7 times | Ink A | 175° C., 20 minutes, 3 times | 12.5% | 10.0% | 1.25 | 4 | 4 | 4 | 4 |
| Example 3 | Ink A | 170° C., 10 minutes, 7 times | Ink A | 180° C., 20 minutes, 3 times | 10.0% | 7.5% | 1.33 | 4 | 4 | 4 | 4 |
| Example 4 | Ink A | 160° C., 10 minutes, 7 times | Ink A | 180° C., 40 minutes, 3 times | 12.5% | 7.0% | 1.79 | 4 | 4 | 4 | 4 |
| Example 5 | Ink A | 150° C., 10 minutes, 7 times | Ink A | 180° C., 60 minutes, 3 times | 15.0% | 7.5% | 2.00 | 4 | 4 | 3 | 3 |
| Example 6 | Ink B | 175° C., 10 minutes, 7 times | Ink A | 170° C., 20 minutes, 3 times | 20.0% | 12.0% | 1.67 | 3 | 4 | 3 | 4 |
| Example 7 | Ink B | 155° C., 10 minutes, 7 times | Ink A | 170° C., 20 minutes, 3 times | 25.0% | 12.0% | 2.08 | 3 | 4 | 3 | 3 |
| Example 8 | Ink A | 180° C., 10 minutes, 7 times | Ink A | 200° C., 40 minutes, 3 times | 7.5% | 5.0% | 1.50 | 4 | 4 | 4 | 4 |
| Example 9 | Ink A | 165° C., 10 minutes, 8 times | Ink A | 170° C., 20 minutes, 2 times | 11.5% | 11.0% | 1.05 | 4 | 4 | 3 | 4 |
| Example 10 | Ink A | 165° C., 10 minutes, 6 times | Ink A | 170° C., 20 minutes, 4 times | 12.0% | 10.5% | 1.14 | 4 | 4 | 4 | 4 |
| Example 11 | Ink A | 165° C., 10 minutes, 5 times | Ink A | 170° C., 20 minutes, 2 times | 12.5% | 11.5% | 1.09 | 4 | 4 | 3 | 4 |
| Example 12 | Ink A | 165° C., 10 minutes, 10 times | Ink A | 170° C., 20 minutes, 4 times | 10.0% | 9.0% | 1.11 | 4 | 4 | 4 | 4 |

As shown in Table 1, in Examples 1 to 12 in which the void ratio S1 of the portion of the electromagnetic wave shielding layer located on the ground electrode is lower than the void ratio S2 of the portion of the electromagnetic wave shielding layer located on the insulating protective layer (that is, the S2/S1 ratio is more than 1.00), the durability of the electromagnetic wave shielding layer was excellent compared to Comparative Example 1 in which the void ratio S1 and the void ratio S2 are equal to each other.

From the results of Examples 1 and 2, it can be seen that in a case in which the S2/S1 ratio is 1.20 or more (Example 2), the durability of the electromagnetic wave shielding layer is further improved.

From the results of Examples 4 and 5, it can be seen that in a case in which the S2/S1 ratio is less than 2.00 (Example 4), the durability of the electromagnetic wave shielding layer is further improved.

The disclosure of JP2021-143242 filed on Sep. 2, 2021 is incorporated herein by reference in its entirety. All docu-

What is claimed is:

1. An electronic device comprising:
   a wiring board having a mounting surface;
   a ground electrode that defines a ground region on the mounting surface;
   an electronic component that is located on the mounting surface and is disposed in the ground region;
   an insulating protective layer that is disposed in the ground region and covers the electronic component; and
   an electromagnetic wave shielding layer that is provided to extend over the insulating protective layer and the ground electrode and that covers the insulating protective layer and is electrically connected to the ground electrode, the electromagnetic wave shielding layer being a solidified product of an ink for forming an electromagnetic wave shielding layer,
   wherein a void ratio S1, which is a void ratio of a portion of the electromagnetic wave shielding layer located on the ground electrode, is lower than a void ratio S2, which is a void ratio of a portion of the electromagnetic wave shielding layer located on the insulating protective layer.

2. The electronic device according to claim 1, wherein a ratio of the void ratio S2 to the void ratio S1 is 1.10 or more.

3. The electronic device according to claim 1, wherein a ratio of the void ratio S2 to the void ratio S1 is 1.20 or more.

4. The electronic device according to claim 1, wherein a ratio of the void ratio S2 to the void ratio S1 is less than 2.00.

5. The electronic device according to claim 1, wherein the void ratio S2 is 25.0% or less.

6. A manufacturing method of an electronic device, the method comprising:

preparing an electronic substrate including a wiring board having a mounting surface, a ground electrode that defines a ground region on the mounting surface, and an electronic component that is located on the mounting surface and is disposed in the ground region;

forming an insulating protective layer that covers the electronic component in the ground region; and forming an electromagnetic wave shielding layer that extends over the insulating protective layer and the ground electrode and that covers the insulating protective layer and is electrically connected to the ground electrode, the electromagnetic wave shielding layer being a solidified product of an ink for forming an electromagnetic wave shielding layer, in which a void ratio S1, which is a void ratio of a portion located on the ground electrode, is lower than a void ratio S2, which is a void ratio of a portion located on the insulating protective layer, wherein the forming an electromagnetic wave shielding layer includes applying a first ink for forming an electromagnetic wave shielding layer to a region that extends over the insulating protective layer and the ground electrode and sintering the first ink for forming an electromagnetic wave shielding layer to form a first layer, and applying a second ink for forming an electromagnetic wave shielding layer onto the ground electrode and sintering the second ink for forming an electromagnetic wave shielding layer to form a second layer, in which a portion of the first layer located on the ground electrode and the second layer are formed in a mutually laminated disposition, and at least one of a sintering temperature for forming the second layer being higher than a sintering temperature for forming the first layer or a sintering time for forming the second layer being longer than a sintering time for forming the first layer is satisfied.

7. The manufacturing method of an electronic device according to claim 6, wherein the application of the first ink for forming an electromagnetic wave shielding layer in the formation of the first layer and the application of the second ink for forming an electromagnetic wave shielding layer in the formation of the second layer are each performed by using an ink jet recording method, a dispenser method, or a spray method.

8. The manufacturing method of an electronic device according to claim 6, wherein, in the forming an insulating protective layer, an ink for forming an insulating protective layer is applied by an ink jet recording method, a dispenser method, or a spray method to form the insulating protective layer.

* * * * *